(12) United States Patent
Chen et al.

(10) Patent No.: US 10,476,369 B2
(45) Date of Patent: Nov. 12, 2019

(54) HIGH-EFFICIENCY FULLY SOFT-SWITCHING SINGLE-STAGE THREE-LEVEL (SS-3) POWER AMPLIFIER

(71) Applicant: GuangDong Redx Electrical Technology Limited, Dongguan (CN)

(72) Inventors: Xue Jian Chen, Dongguan (CN); Shilin Guo, Dongguan (CN); Jianhui Su, Hefei (CN)

(*) Notice: Subject to any disclaimer, the term of this patent is extended or adjusted under 35 U.S.C. 154(b) by 0 days.

(21) Appl. No.: 15/648,453

(22) Filed: Jul. 12, 2017

(65) Prior Publication Data

US 2018/0034359 A1  Feb. 1, 2018

Related U.S. Application Data

(60) Provisional application No. 62/360,975, filed on Jul. 12, 2016.

(51) Int. Cl.
  *H02M 3/335* (2006.01)
  *H02M 1/08* (2006.01)
  (Continued)

(52) U.S. Cl.
  CPC ....... *H02M 1/083* (2013.01); *H02M 3/33592* (2013.01); *H03F 3/2171* (2013.01);
  (Continued)

(58) Field of Classification Search
  CPC ......... H02M 3/33538; H02M 3/33546; H02M 3/33515; H02M 3/33576; H02M 3/33553; H02M 3/33507; H02M 3/33592; H02M 3/33523; H02M 3/3353; H02M 3/33569; H02M 2001/0058; H02M 1/083; H03K 2217/0045; H03K 2217/0009; H03K 2/217; H03K 17/567; H03K 17/166; H03F 3/217; H03F 3/2171; H03F 3/2173; Y02B 70/1491; Y02B 70/1475
  See application file for complete search history.

(56) References Cited

U.S. PATENT DOCUMENTS

| 8,416,956 B2* | 4/2013 | Honda | H03F 1/52 330/207 A |
|---|---|---|---|
| 2013/0121038 A1* | 5/2013 | Ryu | H02J 3/383 363/21.14 |

(Continued)

*Primary Examiner* — Yusef A Ahmed
*Assistant Examiner* — Bryan R Perez
(74) *Attorney, Agent, or Firm* — Jundong Ma

(57) ABSTRACT

The present disclosure relates to a circuit arrangement which comprises one high-efficiency fully soft-switching single-stage 3-level power amplifier with dual auxiliary networks. The primary-side passive auxiliary network is formed by one inductor and two capacitors to extend soft switching ranges and avoid switching loss. The secondary-side active auxiliary network is constituted of four switches, three capacitors and two inductors which not only removes or maximally reduces otherwise occurring disruptive spikes but also assists zero voltage switching (ZVS) for switches of active auxiliary network. A predictive gate drive method for driving power switches is presented to guarantee ZVS turn-on. The proposed circuit achieves high level of integration without bulky dc link capacitor, and high-efficiency by single-stage conversion and ZVS for all the switches under different operating conditions.

9 Claims, 19 Drawing Sheets

(51) Int. Cl.
*H03K 17/567* (2006.01)
*H03F 3/217* (2006.01)
*H03K 17/16* (2006.01)
*H02M 1/00* (2006.01)

(52) U.S. Cl.
CPC ......... *H03F 3/2173* (2013.01); *H03K 17/166* (2013.01); *H03K 17/567* (2013.01); *H02M 2001/0058* (2013.01); *H03F 3/217* (2013.01); *H03K 2217/0009* (2013.01); *H03K 2217/0045* (2013.01); *Y02B 70/1475* (2013.01); *Y02B 70/1491* (2013.01)

(56) References Cited

U.S. PATENT DOCUMENTS

| | | | |
|---|---|---|---|
| 2014/0159811 A1* | 6/2014 | Chen | H03F 3/2171 330/251 |
| 2015/0263634 A1* | 9/2015 | Fu | H02M 3/33569 363/21.02 |

* cited by examiner

HIGH-EFFICIENCY FULLY SOFT-SWITCHING SINGLE-STAGE THREE-LEVEL (SS-3) POWER AMPLIFIER

CROSS-REFERENCE TO RELATED APPLICATION

This application claims the benefit under 35 U.S.C. § 119(e) of Provisional Patent Application No. 62/360,975, filed Jul. 12, 2016, the entire disclosure of which is hereby incorporated by reference.

RELATED ART

1. Technical Field

The present disclosure generally relates to a power conversion system, and more particularly, relates to a high-efficiency single-stage isolated power amplifier or inverter.

2. Description of the Related Art

A conventional power amplifier, such as a class-D power amplifier, usually requires at least two stages. The first stage (referred to as a switching-mode isolated DC-DC power supply) is necessitated to provide sufficient DC bus voltage for powering power amplifiers and the second stage (referred to as power amplifying stage) is used to amplify an input audio signal. Such a two-stage or multi-stage power amplifier incurs power losses which results in lowering the system efficiency. Therefore, reducing the number of power stages is one efficient way to increase the system efficiency.

Efforts have been made to integrate the power supply stage and power amplifiers into one compact single stage. In particular, U.S. Pat. No. 9,312,823 (hereinafter referred to as "the '823 patent"), which is hereby incorporated by reference in its entirety, discloses a single stage switching power amplifier (herein after referred to "the '823 amplifier") to increase the system efficiency. However, the '823 amplifier is typical 2-level single-stage power amplifier where the schematic circuit diagram is shown in FIG. 1.

Another possibility for reducing the switching losses is included in the generic term soft-switching. The aim of soft switching consists in preventing the simultaneous occurrence of high values of current and voltage during a switching-on or switching-off operation. The value of the power loss as a product of current and voltage thus remains small, and so do the values of the switching-on or switching-off losses and the mean value of switching loss.

There are various techniques for the implementation of the soft switching, which can be split up into the classes of snubber circuits, resonant circuits and quasi-resonant circuits, especially applying to DC/DC converters.

U.S. Pat. No. 8,644,035 (hereinafter referred to as "the '035 patent") discloses a conventional full-bridge converter (which is shown in FIG. 2A), which is soft switched via two auxiliary inductor and two auxiliary capacitors. The internal drain-to-source capacitances of the MOSFETs are utilized as the snubber capacitors, the series inductor is implemented to provide an inductive current flowing out of the full-bridge legs during the switch turn-on. As the auxiliary networks are working independent of the system operating conditions, they are able to guarantee zero voltage switching from no-load to full-load.

However, there are some setbacks related to the auxiliary networks. Due to the fact that the voltage and frequency across the two auxiliary inductors are very high, the core losses of two inductors are also high. In addition, since the auxiliary circuit should provide enough reactive power to guarantee ZVS (zero voltage switching) at all operating conditions, the peak value of the current flowing through the auxiliary inductor is very high, thereby drastically increasing the MOSFET conduction losses. Furthermore, too much reactive current leads to large voltage spikes on the semiconductor switches due to the delay in the body diode turn-on. The '035 patent discloses a scheme which alleviates the aforementioned issues (such as the "high core losses of the two inductors", "drastic increasing of MOSFET conduction losses", and "excess reactive current" issues) using a scheme involving adaptive adjusting of, inter alia, switching frequency of the converter. However, as shown in FIG. 2B, this scheme is rather complex as it has to introduce an internal current loop and an external voltage loop, as well as another loop which regulates the frequency for the modulator depending upon the load conditions.

Thus, there is a need to address or otherwise alleviates the aforementioned issues associated with the conventional auxiliary commutated ZVS full bridge converter topologies without using a complex scheme involving adaptive adjusting of, inter alia, switching frequency of the converter.

BRIEF SUMMARY

The present disclosure facilitates the provision of a high-efficiency single-stage three-level power amplifier with fully soft switching under substantially all operating conditions, this being achieved in a simple manner with, e.g., dual auxiliary networks and optionally a predictive gate drive.

In one aspect, the present disclosure provides a high-efficiency single-stage three-level (SS-3) switching power amplifier that does not incorporate a rectification process, while achieving fully soft switching across all load conditions and greatly increasing the system efficiency.

In another aspect, the present disclosure provides a single stage SS-3 switching power amplifier comprising an active-snubber circuit, which eliminates voltage spikes, absorbs the energy of leakage inductor and recycles the stored energy to the secondary-side of the isolation transformer sub-circuit and then to the load, thereby further increasing system efficiency.

In still another aspect, the present disclosure provides systems, methods, and circuits for providing zero voltage switching conditions in the present SS-3 switching power amplifier. The primary-side passive auxiliary network provides enough reactive current for the primary-side full-bridge switches, extending the soft-switching range. In particular, the secondary-side lossless auxiliary network with active snubber circuit and a variety of combinations of passive components is utilised to not only eliminate the voltage spikes caused by the leakage inductor of high-frequency transformer but also extend soft-switching range of switches of active auxiliary network. The predictive gate drive method is incorporated to guarantee zero voltage switching for the power switching devices.

In one embodiment, the present disclosure provides a single-stage three-level (SS-3) switching power amplifier circuit comprising: a DC power supply configured to supply power for amplifying an audio input signal; a bridge having two switching legs, each comprising two controlled switching devices connected in series, each switching leg connected between two supply voltage terminals and having a junction point between its series-connected switching devices; a high frequency transformer having a primary winding and two secondary windings, the primary winding being coupled between the junction points of the switching legs; a primary-side passive auxiliary network having two capacitors and one inductor coupled between the center tap of transformer primary and a junction point for providing a voltage between voltages of the supply voltage terminals; a four-quadrant switch like a cycloconverter, secondary-side active auxiliary network and output filter circuit connected to the secondary winding for providing an output voltage of single-stage three-level power amplifier.

In one implementation, said cycloconverter is composed of bidirectional switching devices; said secondary-side active auxiliary network comprises a bridge arrangement of four switching devices, a clamping capacitor, and two auxiliary inductor coupled in series to two auxiliary capacitor; and said output filter is low pass filter which usually comprises an inductor and a capacitor.

In one embodiment, the present disclosure provides a predictive gate drive method for driving the power switching devices, the predictive gate drive method comprising: a) monitoring the drain-to-source voltages of power switching devices so as to inhibit the turning-on of each power switching devices until the drain-to-source voltage has fallen to zero; and b) adjusting the dead-time for different switching devices to guarantee zero voltage switching for switches of said secondary-side active auxiliary network.

BRIEF DESCRIPTION OF THE DRAWINGS

The description of the illustrative embodiments can be read in conjunction with the accompanying figures. It will be appreciated that for simplicity and clarity of illustration, elements illustrated in the figures, unless expressly specified, have not necessarily been drawn to scale. Also, any text and/or any numerical data (numbers) appeared on any drawing figures is provided to illustrate an exemplary embodiment or implementation, and thus is provided for the purpose of illustration and not for the purpose of limitation. For example, the dimensions of some of the elements may be exaggerated relative to other elements. Embodiments incorporating teachings of the present disclosure are shown and described with respect to the figures presented herein, in which.

DETAILED DESCRIPTION

Figure 1:
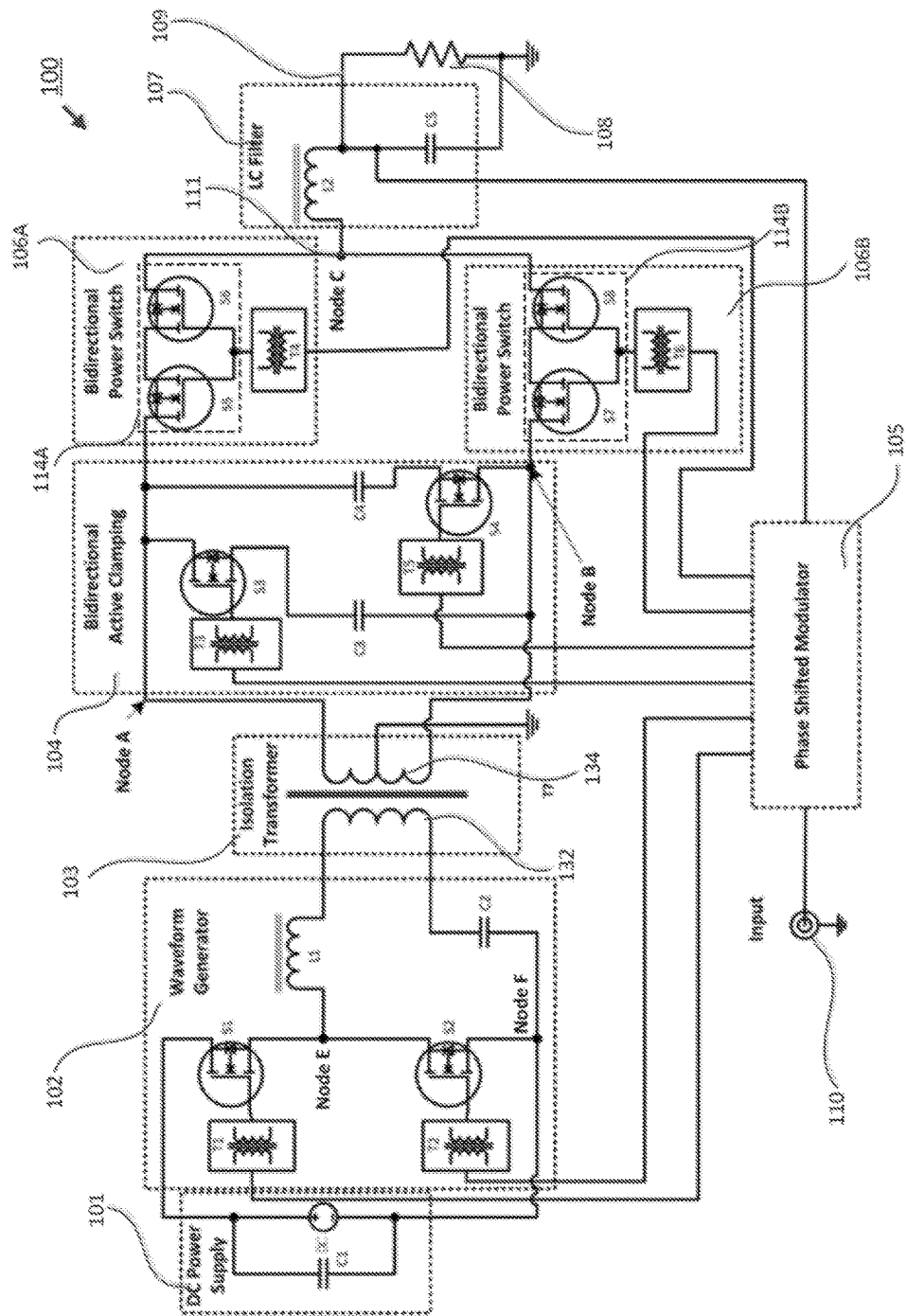
FIG. 1 illustrates a single stage power amplifier system of the related art.
Figure 2A:
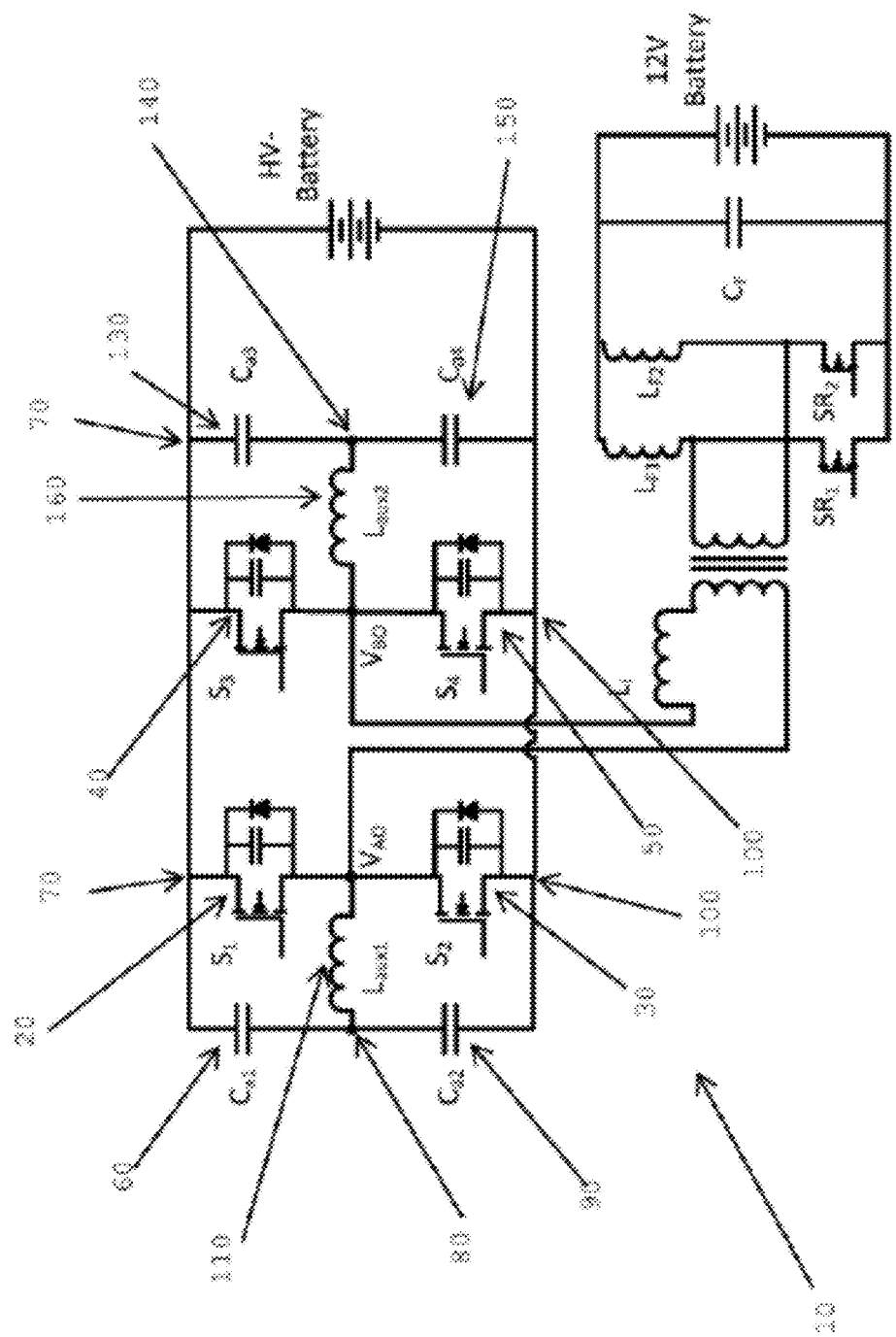
FIGS. 2A-B show diagrams of a power circuit of a full bridge DC-to-DC converter of the related art.
Figure 2B:
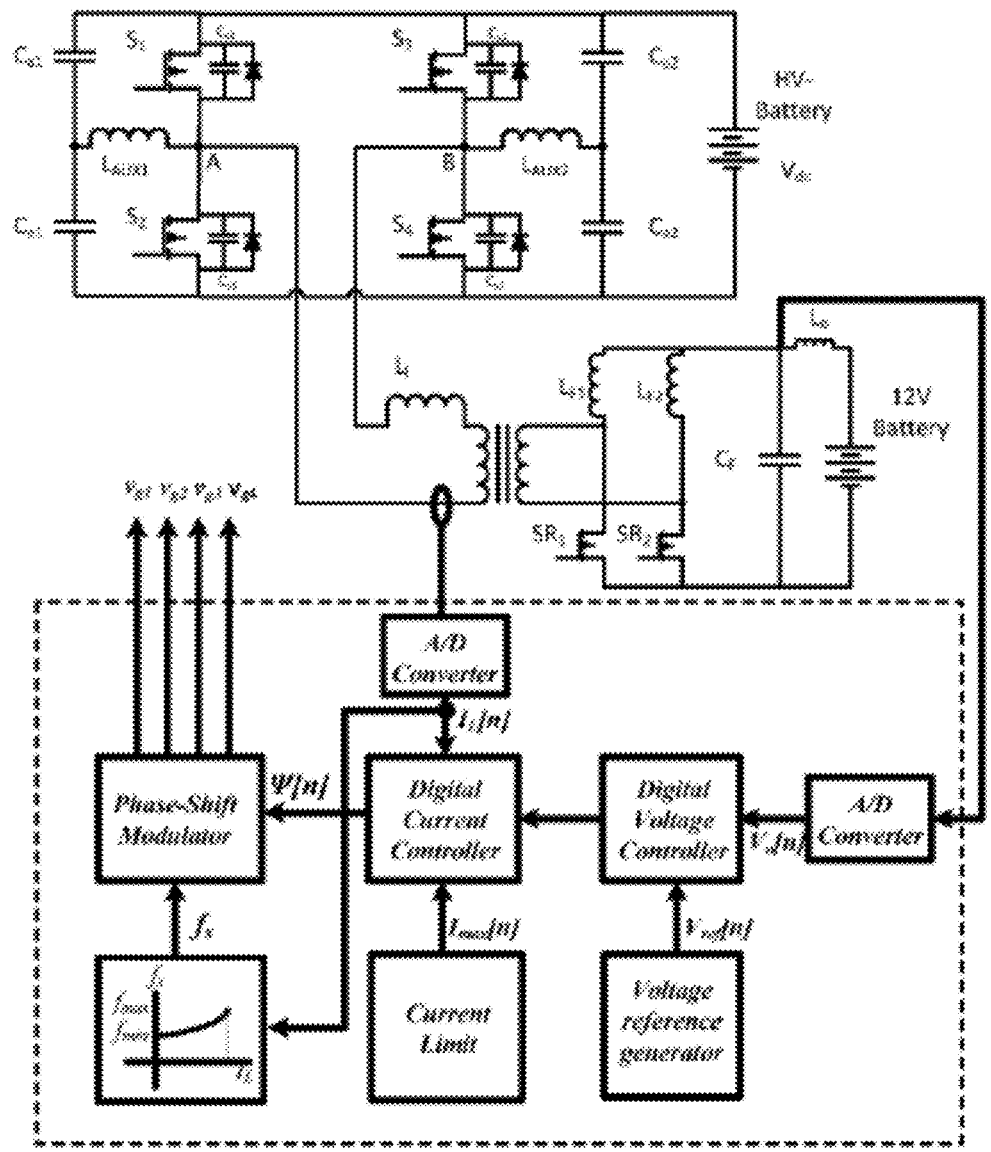

In the following detailed description of exemplary embodiments of the disclosure in this section, specific exemplary embodiments in which the disclosure may be practiced are described in sufficient detail to enable those skilled in the art to practice the disclosed embodiments. However, it is to be understood that the specific details presented need not be utilized to practice embodiments of the present disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. Moreover, the use of the terms first, second, etc. do not denote any order or importance, but rather the terms first, second, etc. are used to distinguish one element from another.

Those of ordinary skill in the art will appreciate that the circuit components and basic configuration depicted in the following figures may vary. Other circuit components may be used in addition to or in place of the components depicted. The depicted example is not meant to imply architectural or other limitations with respect to the presently described one or more embodiments and/or the general disclosure.

Within the descriptions of the different views of the figures, the use of the same reference numerals and/or symbols in different drawings indicates similar or identical items, and similar elements can be provided similar names and reference numerals throughout the figure(s). If a reference numeral is once used to refer to a plurality of like elements, unless required otherwise by context, the reference numeral may refer to any, a subset of, or all of, the like elements in the figures bearing that reference numeral. The specific identifiers/names and reference numerals assigned to the elements are provided solely to aid in the description and are not meant to imply any limitations (structural or functional or otherwise) on the described embodiments.

In the description, relative terms such as "left," "right," "vertical," "horizontal," "upper," "lower," "top" and "bottom" as well as any derivatives thereof (e.g., "left side," "upper sub winding," etc.) should be construed to refer to the logical orientation as then described or as shown in the drawing figure under discussion. These relative terms are for convenience of description and are not intended to convey any limitation with regard to a particular orientation.

As used herein, the terms "amplify", "amplification", "amplifying" and "amplified", in the context of signal amplification as applicable to the present disclosure, refer to and encompass both amplification and de-amplification of a signal level of a source input signal in either the same polarity or the opposite polarity of the source input signal. Similarly, as used herein, the term "gain", in the context of amplification of a signal, refers to both gain and attenuation.

As used herein, the terms "signal level", "input level" and other similar terms, in the context of signal modulation or amplification, unless otherwise specified with respect to a particular measurement characteristic, refer to any of voltage level, current level, power level and any combination thereof, as applicable.

For the ease of discussion, a reference numeral referring to a node or device (such as a transformer) may also be used to refer to the signal at the node or the signal drives the device, when the term "signal" precedes the reference numeral. For example, the signal at node A may be referred to as signal A, the signal driving transformer T1 may be referred to as drive signal T1, and the differential signal across nodes A and B may be referred to as signal A-B.

For the ease of discussion, a reference numeral referring to an electrical component, such as an inductor, a capacitor, or a resistor, may also be used to refer to the value of the applicable innate property of the electrical component. For example, L1, which may be used to refer to an inductor, may also be used to refer to the inductance of the inductor. C2, which may be used to refer to a capacitor, may also be used to refer to the capacitance of the capacitor.

Those of ordinary skill in the art will appreciate that the components and basic configuration depicted in the following figures may vary. Other similar or equivalent components may be used in addition to or in place of the components depicted. A depicted example is not meant to imply limitations with respect to the presently described one or more embodiments and/or the general disclosure.

In order to improve the system efficiency and power density performance, presented as one aspect of the disclosure is a high efficiency fully soft-switching single-stage three-level (SS-3) switching power amplifier which overcomes the shortcomings associated with the hard-switched inverter and achieves a high level of integration. In one embodiment, the present disclosure provides circuits and methods for providing zero voltage switching conditions in the present SS-3 switching power amplifier. In one embodiment, the present disclosure provides passive auxiliary network, active auxiliary network and predictive gate drive method to guarantee ZVS under different load conditions, thereby significantly reducing semiconductor switching losses.

Figure 3A:
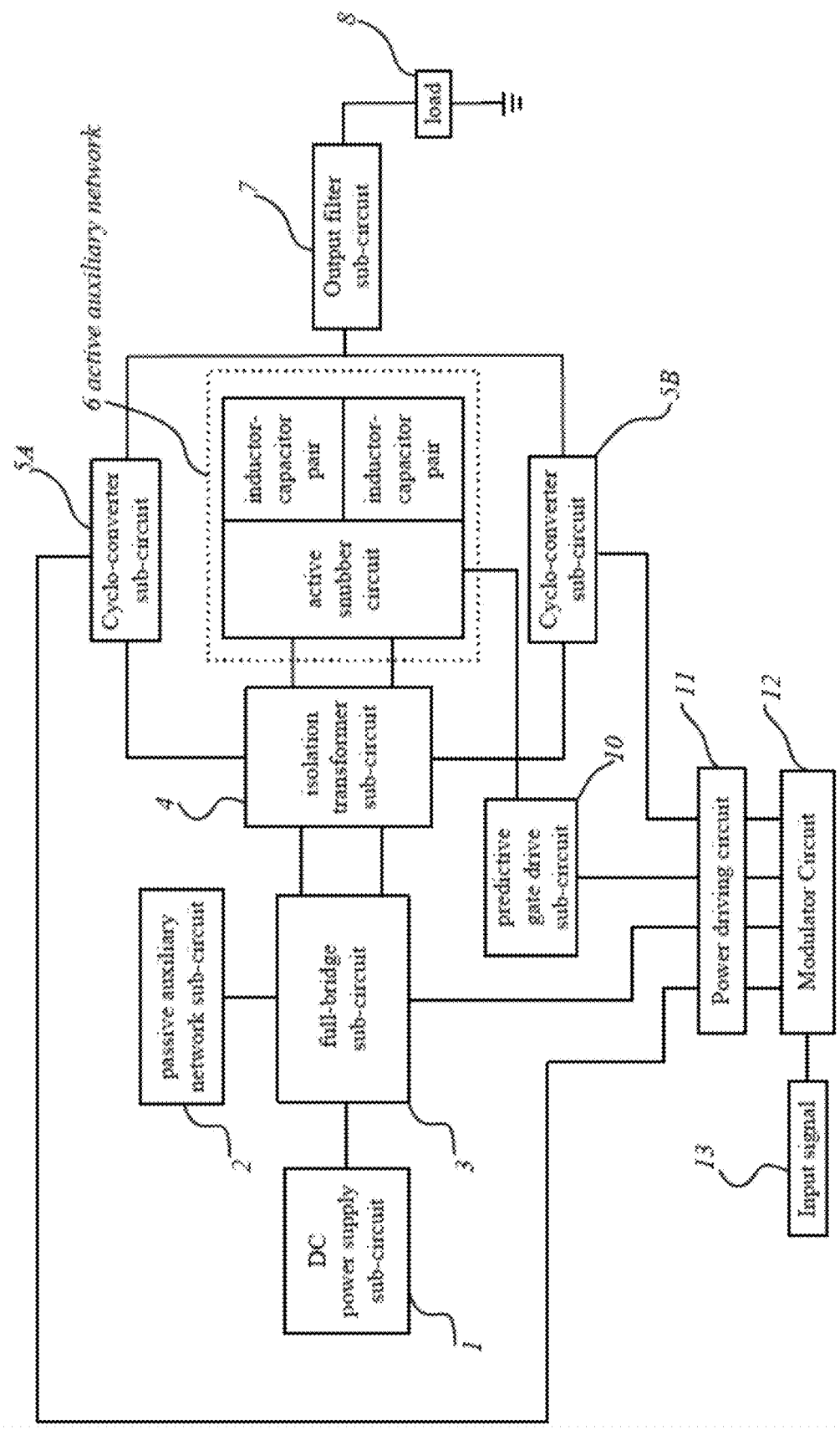
FIG. 3A illustrates simplified functional block diagram illustrating a disclosed single-stage three-level switching power amplifier, in accordance with one or more embodiments of the present disclosure.

With reference now to the figures, and beginning with FIG. 3A, there is illustrated a functional block diagram illustrating a single-stage three level (SS-3) power amplifier in accordance with an embodiment of the present disclosure. In FIG. 3A, there are following circuit blocks: DC power supply sub-circuit 1, a primary-side passive auxiliary network sub-circuit 2, a full-bridge sub-circuit 3, a high frequency isolation transformer sub-circuit 4, a four-quadrant switch (like a cycloconverter) sub-circuit 5, a secondary-side active auxiliary network sub-circuit 6 with snubber circuit and passive components, an output filter sub-circuit 7, predictive gate drive sub-circuit 10, modulator circuit 12, and power driving circuit 11.

DC power supply 1 is configured to supply power needed to amplify an audio input signal 13 and store any return energy flowing back from one or more component modules of disclosed single stage power amplifier.

The primary-side passive auxiliary network 2 provides enough reactive current for the primary-side full-bridge switches, extending the soft-switching range. In one implementation, the primary-side passive auxiliary network 2 comprises capacitors $C_{a1}$ and $C_{a2}$ and inductor $L_{a1}$ shown in FIG. 3B. The capacitors $C_{a1}$ and $C_{a2}$ are connected in series with one another between the $+U_{in}$ and 0V supply terminals, so that they form a capacitive voltage divider; it is assumed here that they have equal capacitances which are sufficiently large that they provide at their junction 107 a substantially constant voltage $+U_{in}/2$ during steady state operations of the single-stage power amplifier. It can be appreciated that this need not necessarily be that case, and that the junction 107 can alternatively be provided directly from a split voltage supply. The inductor $L_{a1}$ is connected between the center tap 108 of transformer primary and the junction 107. The inductor $L_{a1}$ is configured to cooperate with the auxiliary capacitors $C_{a1}$ and $C_{a2}$ to provide zero voltage switching under all load conditions of the single-stage power amplifier.

The full-bridge sub-circuit 3 is configured to receive power from DC power supply sub-circuit 1 and generate high-frequency switching signals that can drive isolation transformer sub-circuit 4 so as to produce high-frequency amplified signals. In one implementation shown in FIG. 3B, the full-bridge sub-circuit comprises two switching legs, the first switching leg comprising two controlled switching devices (M1 and M2) connected in series, the first switching leg connected between two supply voltage terminals (105 and 106) and having a junction point 101 between its series-connected switching devices; the second switching leg comprising two controlled switching devices (M3 and M4) connected in series, the second switching leg connected between two supply voltage terminals (105 and 106) and having a junction point 102 between its series-connected switching devices. The four switching devices M1-M4 may be implemented with MOSFETs, bipolar transistors, or any other kind of switching devices and they are driven by driving signals M1-M4 outputted by isolation driving transformers, respectively.

Figure 4:
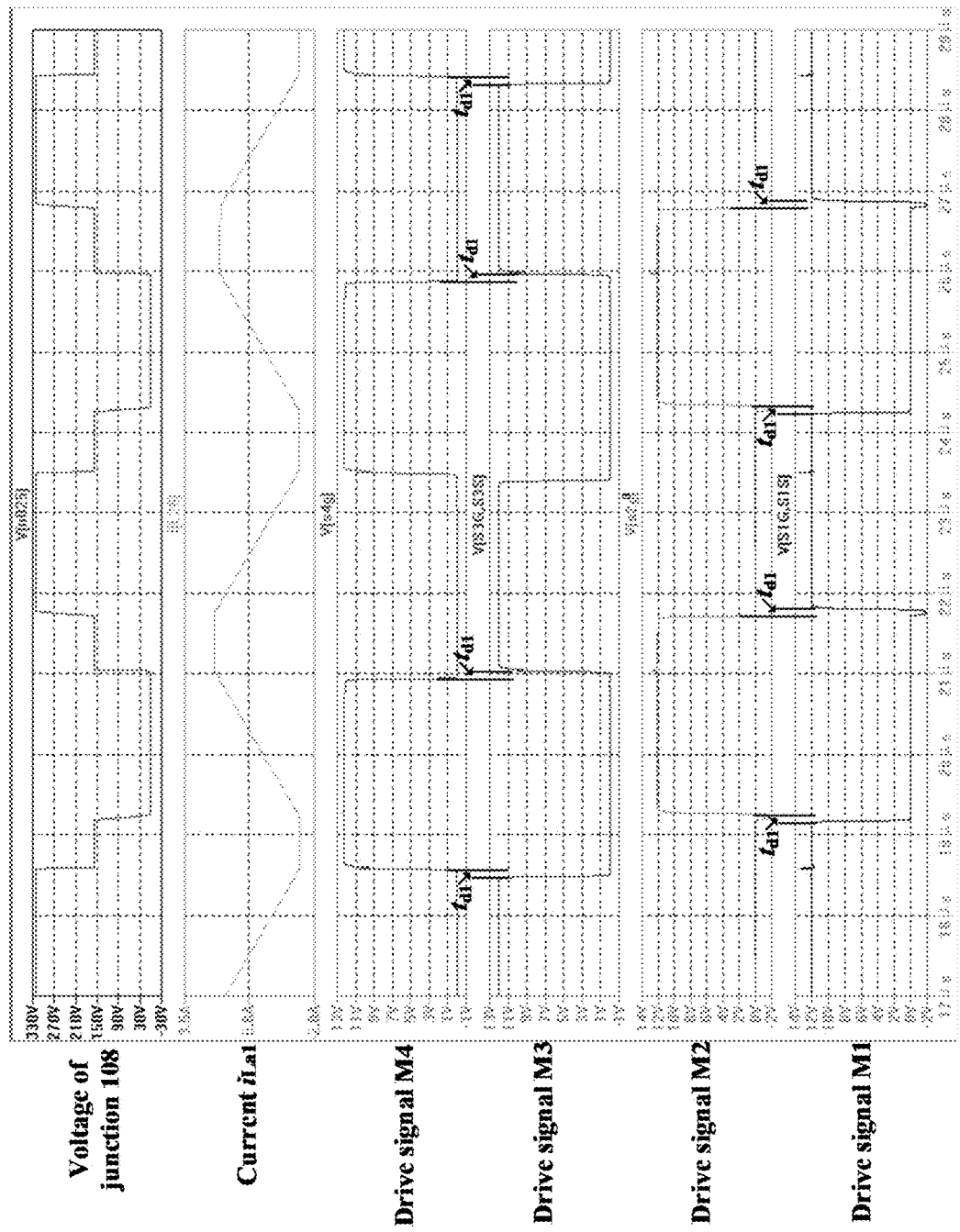
FIG. 4 illustrates exemplary waveforms of the primary-side auxiliary inductor current, and the driving signals of primary-side switches and junction point voltage, according to one or more embodiments of the present disclosure.

A skilled artisan appreciates that the voltage of junction 105 is $+U_{in}$ and the voltage of junction 106 is 0V. The capacitors $C_{a1}$ and $C_{a2}$ form a capacitive voltage divider, thus the voltage of junction 107 is the constant value $+U_{in}/2$. The voltage of junction 108 is, as illustrated in FIG. 4, closely related to the direction of auxiliary inductor current $i_{La1}$.

Figure 3B:
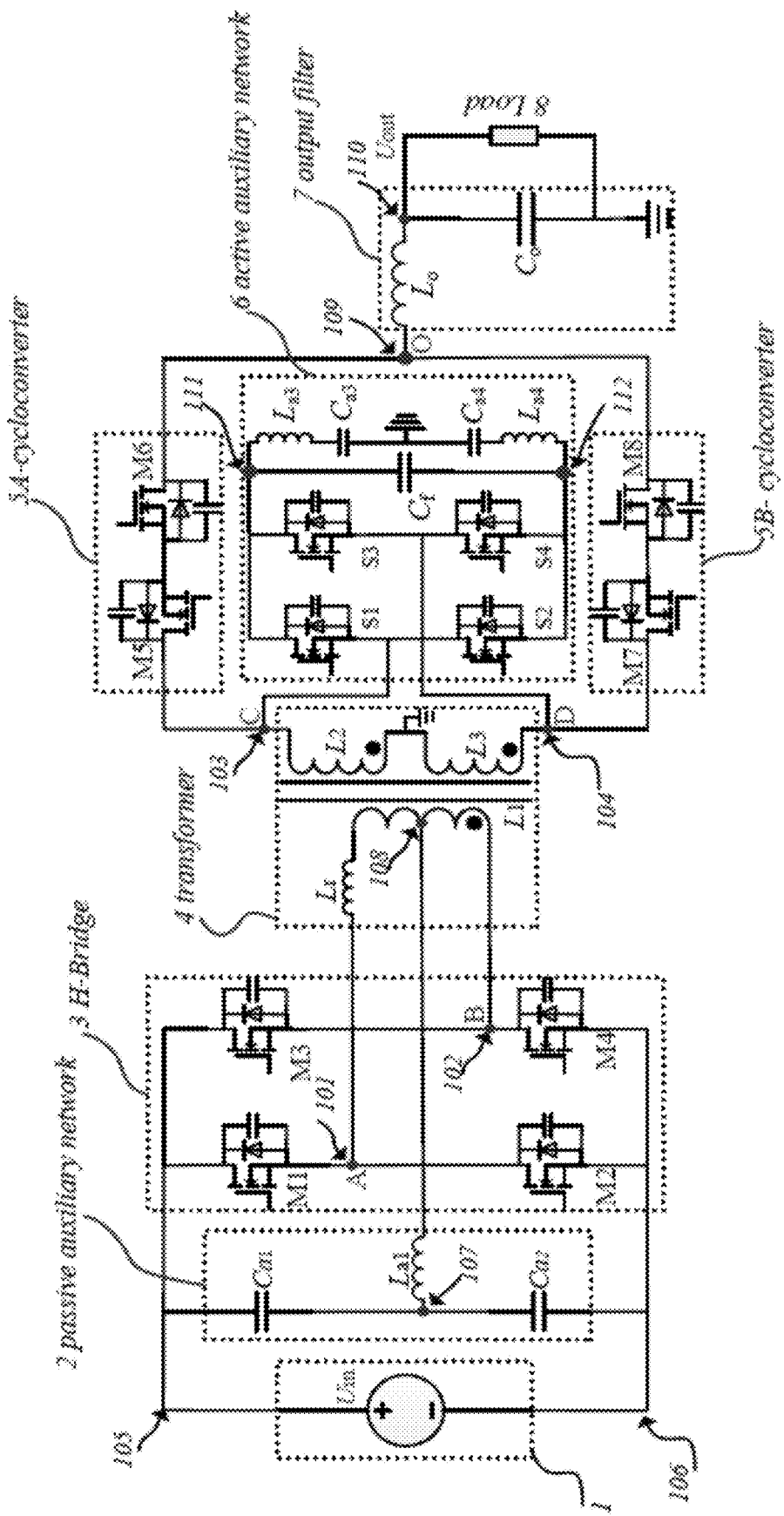
FIG. 3B illustrates a schematic of an exemplary implementation of the present disclosure relating to high-efficiency fully soft-switching single-stage three-level power conversion apparatus, in accordance with one or more embodiments of the present disclosure.

The operation of primary-side passive auxiliary network 2 and full-bridge sub-circuit 3 is described in detail below with additional reference to FIG. 4. These waveforms comprise the driving signals of power switches M1-M4, current $i_{La1}$ of the inductor $L_{a1}$ as shown in FIG. 3B and voltage of junction 107. The driving signals M1 and M2 (M3 and M4) are both 50% duty cycle square waves inverse with respect to each other. There is a brief dead time $t_{d1}$ between the driving signals M1 and M2; this ensures that the switches M1 and M2 are not simultaneously conductive, thereby preventing a short circuit across the supply terminals 105 and 106. Similarly, there is brief dead time $t_{d2}$ between the driving signals M3 and M4 to ensure that the switches M3 and M4 are not simultaneously conductive. The driving signals M3 is delayed in relation to the driving signal M1, which corresponds to a phase shift and is varied by the control circuit in known manner for controlling the output voltage at the output terminals 110 as indicated above.

The high frequency isolation transformer sub-circuit 4 usually comprises one or more isolation transformers, and has a primary side and a secondary side as defined by its primary and secondary windings of its one or more isolation transformers. In one implementation, isolation transformer 4 has a center-tapped winding on the primary side and a center-tapped winding on the secondary side. A series inductor $L_r$ is the leakage inductor of the high frequency transformer.

As well known, a conventional auxiliary commutated ZVS full bridge converter topology working on a fixed frequency approach may not work well with light load situation or heavy load situation. The '035 patent proposes a rather complex load adaptive variable switching frequency control method (where the switching frequency is higher for heavy loads and lower for light loads). The present disclosure, however, provides a novel circuit design (circuit arrangement), which is through a circuit innovation, to address the issue which the '035 patent was trying to address, namely, the full bridge circuit does not going to work well with light load situation or heavy load situation.

More specifically, with the present disclosure, in order to achieve ZVS for switches M1-M4, the parasitic capacitor in parallel with the incoming switch is configured to get completely discharged and the parasitic capacitor in parallel with the outgoing switch in the same bridge leg is configured to be fully charged. The auxiliary inductor $L_{a1}$ is configured to provide enough reactive current to make sure the parasitic capacitors of switches M1-M4 to fully discharge or charge under different operating conditions from light load to heavy load.

Figure 9A:
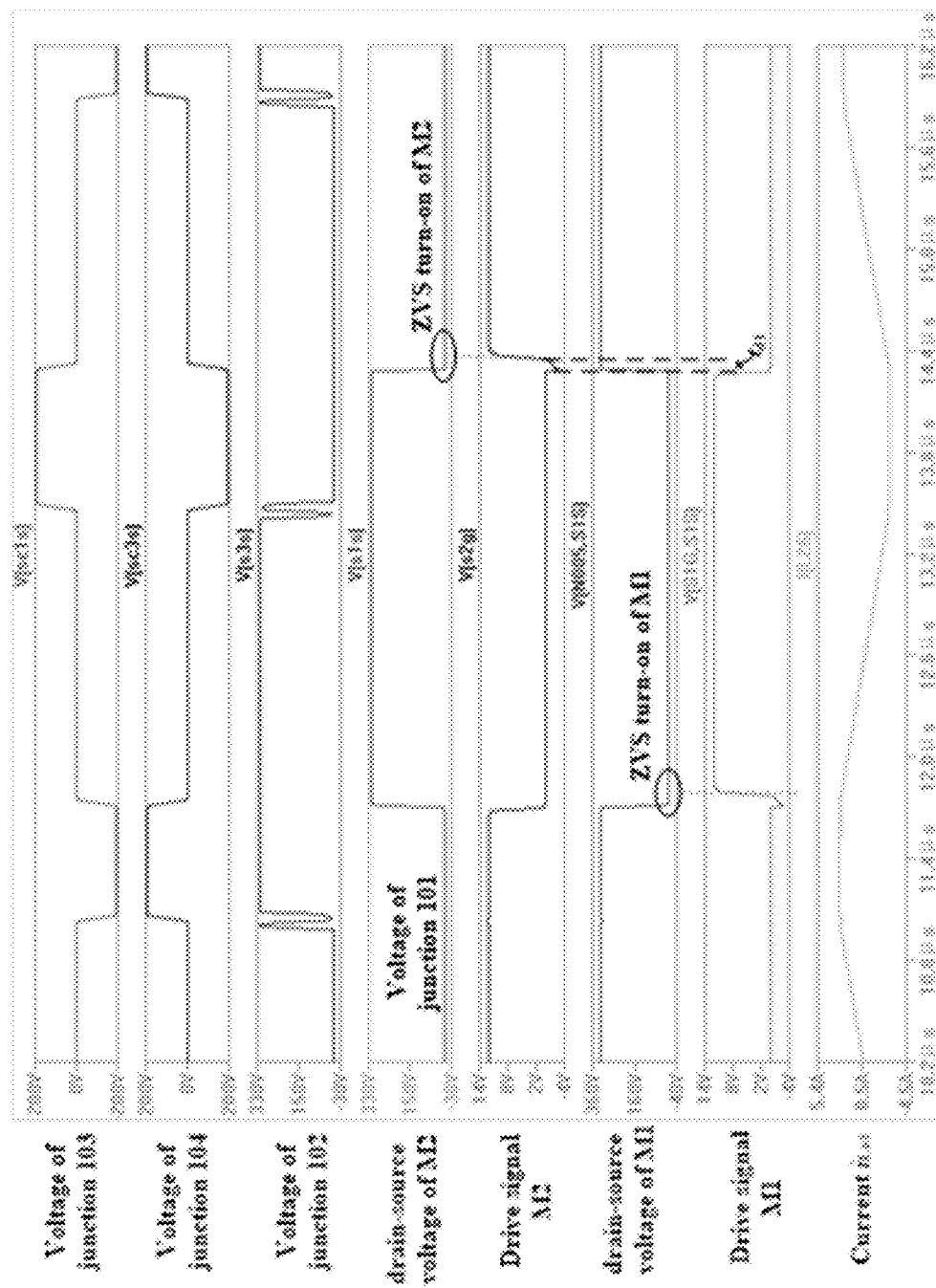
FIGS. 9A-E illustrate exemplary waveforms of ZVS commutation operation of all switches, according to one or more embodiments of the present disclosure.
Figure 9B:
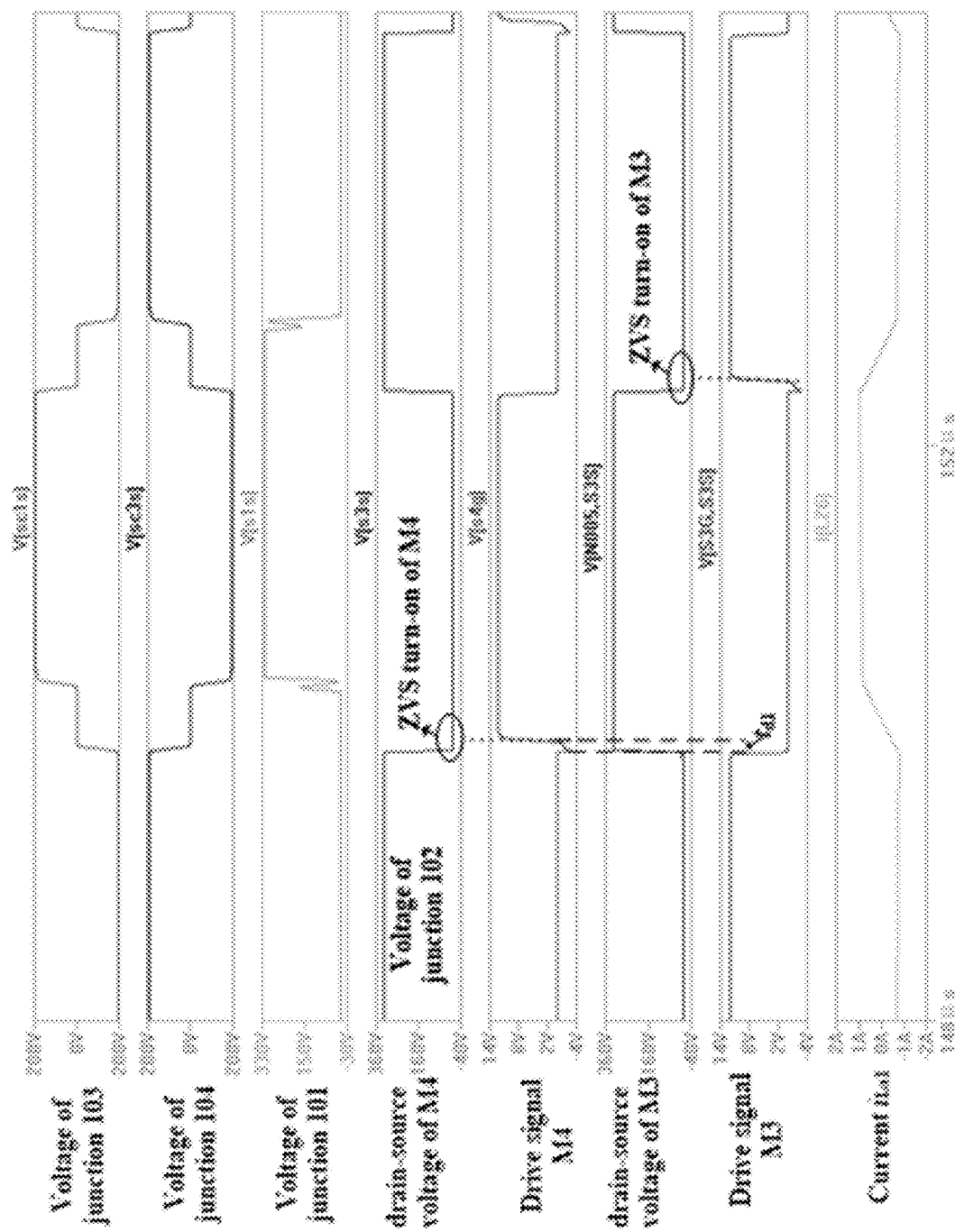

Turning to FIGS. 9A and 9B, the voltage of junction 103 tracks the voltage $U_{AB}$ (which is the difference between the voltage of junction 101 and the voltage of junction 102.). At the same time, it is shown that $U_{103}=-U_{104}$. FIG. 9A illustrates zero voltage switching at the turn-on transition of switches M1 and M2. As shown in FIG. 9A, the drain-to-source voltages of M1 and M2 have dropped to zero before switches M1 and M2 are turned on, in other words, M1 and M2 can realize ZVS turn-on completely. The auxiliary inductor $L_{a1}$ is configured to provide enough reactive current $i_{La1}$ to extend the soft-switching range and guarantee ZVS of M1 and M2 under all operating conditions. Similar waveforms for the switches M3 and M4 can be observed in FIG. 9B, ZVS of switches M3 and M4 is obtained as well.

That is, as long as the auxiliary inductor $L_{a1}$ can provide enough reactive current $I_{La1}$, the soft switching of switches M1-M4 can be achieved completely. For example, if the auxiliary inductor $L_{a1}$ is configured to be 50 µH for the 250 W SS-3 power amplifier, the soft switching of switches M1-M4 is achieved under any load conditions. Although the enough reactive current in the conventional full bridge converter can guarantee zero voltage switching from no-load to full-load, there are some setbacks related to the conventional auxiliary circuit. For example (as described in the '035 patent), the peak value of the current flowing through the auxiliary inductor is very high, thereby drastically increasing the MOSFET conduction losses; due to the fact that the voltage and frequency across the auxiliary inductor is very high, the core losses of this inductor are also high; too much reactive current leads to large voltage spikes on the semiconductor due to the delay in the body diode turn-on.

The presently disclosed configuration is able to minimize the MOSFET conduction losses and core losses in that the magnitude of the auxiliary inductor current is adaptive to the load current, i.e., small at heavy load and large at light load. According to FIG. 3B, the peak value $I_{La1}$ of the auxiliary inductor current iLa1 can be obtained as follows:

$$I_{La1} = \frac{V_{in}(1-d)T_s}{8L_{a1}}$$

It can be seen that the peak value $I_{La1}$ of the auxiliary inductor current is controlled by the duty cycle d. For the power amplifier application, the duty cycle d is small at light loads and the duty cycle d is large at heavy loads. Thus, at light loads, the magnitude of the auxiliary inductor current is higher to provide enough inductive current to ensure ZVS and at heavy loads, the magnitude of the auxiliary inductor current is lower to avoid too much reactive current and to reduce the semiconductor conduction losses and core losses.

In summary, the single inductor auxiliary network 2 provides the desirable peak current value for ZVS operation during the dead time but has significantly lower RMS value of reactive current. Therefore, the core losses of the inductor and semiconductor conduction losses are lower. Additionally, the secondary-side active clamper network 6 is configured to recycle leakage inductor energy and suppress large voltage spikes caused by the resonance of the leakage inductor Lr and the parasitic capacitance of switches. In an experimental prototype, $C_{a1}=C_{a2}=1$ µF, $L_{a1}=80$ µH, $L_r=2$ µH.

Turning to the secondary side, an exemplary sub-circuit 5 is configured to receive amplified waveform signals from isolation transformer sub-circuit as well as input signals 13, and generate and supply an amplified three-level modulated signal to output filter circuit 7.

In one implementation, the sub-circuit 5 comprises bidirectional power switches 5A and 5B shown in FIG. 3B. The bidirectional power switch 5A or 5B may be configured using two switching devices in a manner similar to the manner in which bidirectional power switches are configured using two MOSFETs, as illustrated and described in the incorporated '823 patent.

In another implementation, the bidirectional power switch may be configured as the bidirectional power switches, as a whole, functions as a high-frequency switch and conducts in both directions. Thus, 5A comprises bidirectional power switch configured using a pair of switching devices M5 and M6, and likewise, 5B comprises bidirectional power switch configured using a pair of switching devices M7 and M8. The driving signals M5 (M6) and M7 (M8) are both 50% duty cycle square waves inverse with respect to each other. There is a commutation overlap time $t_s$ between the driving signals M5 (M6) and M7 (M8); this ensures that switches M5 (M6) and M7 (M8) can achieve natural commutation.

Figure 12:
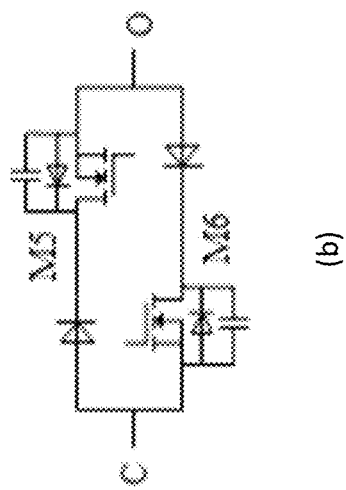
FIG. 12 illustrates two exemplary ways which may be used to implement a four-quadrant switch like a cycloconverter (M5,M6) or (M7, M8) used in the present disclosure, according to one or more embodiments of the present disclosure.
Figure 12:
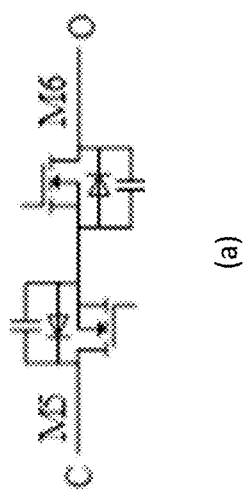

Four-quadrant switches may be used to implement sub-circuit 5 due to the output voltage $U_{out}$ and output current for power amplifier are both positive and negative. In one implementation, cycloconverters are used. Cycloconverters are a class of converters requiring four-quadrant switches. There are two ways of constructing a four-quadrant switch. As illustrated in the (a) part of FIG. 12, two current-bidirectional two-quadrant switches can be connected back-to-back. Another approach is the antiparallel connection of two voltage-bidirectional two-quadrant switches, as shown in the (b) part of FIG. 12.

As shown in FIGS. 5 and 9A-E, The ZVS turn-on and turn-off of switching devices M5-M8 can be achieved due to active switches S1-S4 in the secondary-side active network 6. For example, before M5 and M6 are turned on, the switches S1 (S2) and S3 (S4) have been turned on, therefore the secondary-side voltages $U_{103}$ and $U_{104}$ are equal. At the same time, the voltage $U_{103}$ is equal to the opposite value of voltage $U_{104}$ because of the characteristic of secondary-side winding voltages of high-frequency transformer 4, which guarantees the $U_{103}=U_{104}=0$. Additionally, M7 and M8 are in the conduction state, thus the voltage $U_{co}$ is equal to zero. Ultimately, ZVS turn-on of M5 and M6 can be achieved completely.

Figure 9C:
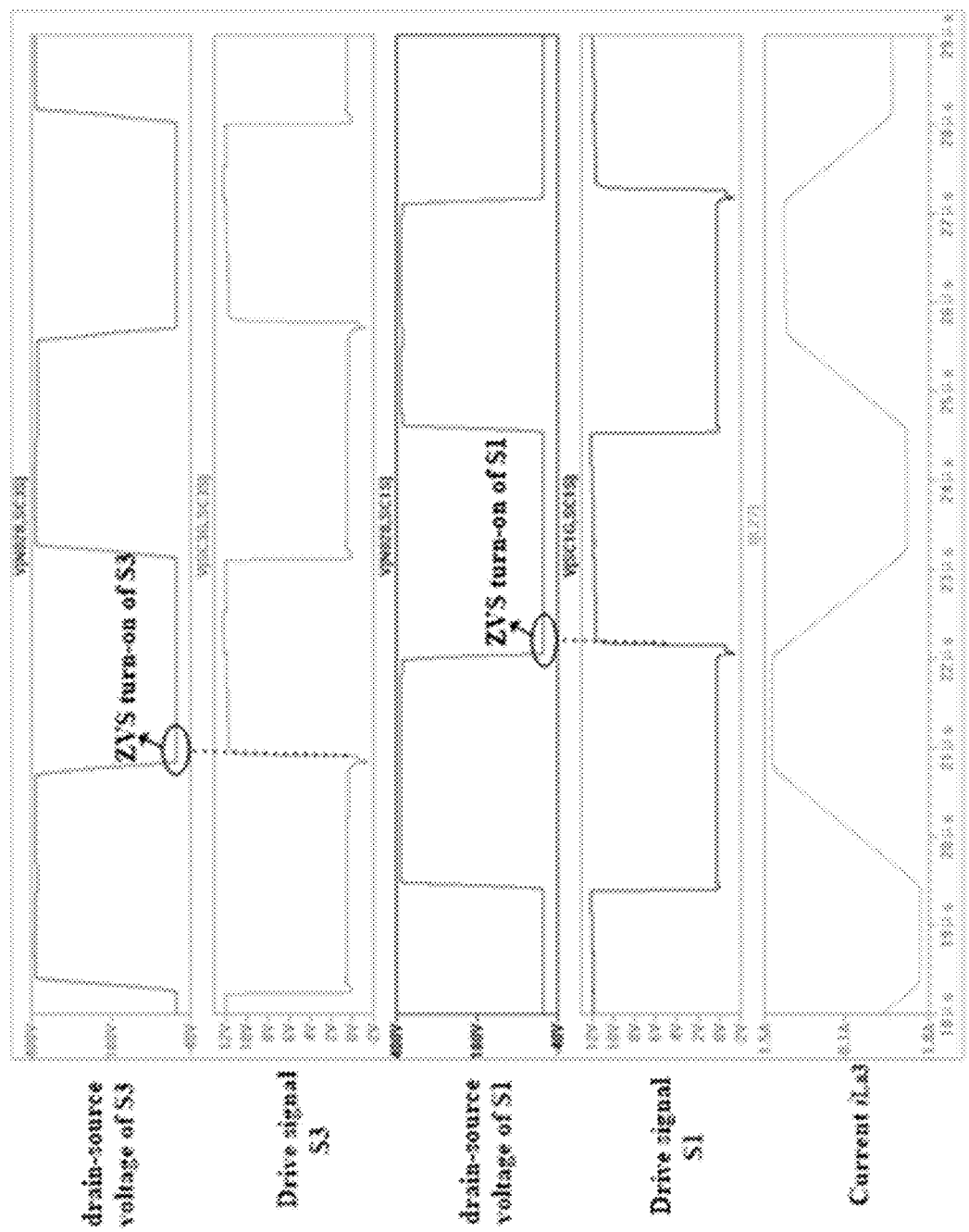

As shown in FIG. 9C, the voltage $U_{co}$ has been maintained at zero during the turn-on and turn-off transition of switches M5\M6. ZVS turn-on and turn-off of M5\M6 is achieved completely without incurring any switching loss. The voltage $U_{DO}$ has been maintained at zero during the turn-on and turn-off transition of switches M7\M8 as well. Similarly, switches M7\M8 achieve ZVS turn-on an ZVS turn-off.

Secondary-side active auxiliary network 6 is coupled to the secondary side of high frequency transformer sub-circuit 4, and configured to absorb the energy associated with the ringing and spikes generated by transformer leakage inductor $L_r$ and return the absorbed energy back to the primary side of high frequency transformer 4 or supply the absorbed energy to the secondary side and then to the equivalent load 8.

In one implementation, secondary-side active auxiliary network 6 comprises four switches (S1-S4), clamping capacitor ($C_f$), two inductor-capacitor pairs ($L_{a3}$, $C_{a3}$) and ($L_{a4}$, $C_{a4}$) shown in FIG. 3B. If there were no secondary-side active auxiliary network 6, the voltage across junction 103 and 104 would have included excess ringing and voltage spikes. With secondary-side active auxiliary network 6, the voltage waveforms of junction 103 and 104 have clean waveforms without excess ringing and voltage spikes. Switches S1-S4 make up a full bridge configuration, with the lower end of switch S1 and the upper end of switch S2 coupled to the upper terminal of the secondary winding (namely, junction C) and the lower end of switch S3 and the upper end of switch S4 coupled to the lower terminal of the secondary winding (namely, junction D). The upper end of switches S1 and S3 are coupled to one terminal of the clamping capacitor $C_f$ (namely, junction 111) while the lower end of switches S2 and S4 are coupled to other terminal of the clamping capacitor $C_f$ (namely, junction 112). In one implementation, switches S1-S4 are implemented using MOSFETs each having its internal body diode.

As illustrated, MOSFETs S1-S4 are configured such that their respective inversely coupled body diodes are reverse-biased. In another implementation, switches S1-S4 may be implemented using other type of switches each not having a body diode of its own. In such an implementation, for each of switches S1-S4, a diode is added to be coupled across the upper and lower terminals of each switch accordingly so as to implement the configuration of the corresponding MOSFETs illustrated in FIG. 3A.

As to each inductor-capacitor pair, its inductor ($L_{a3}$ or $L_{a4}$) is connected in series with its capacitor ($C_{a3}$ or $C_{a4}$), with its inductor ($L_{a3}$ or $L_{a4}$) having one end connected to one terminal (junction 111 or junction 112) of the clamping capacitor $C_f$ and its capacitor ($C_{a3}$ or $C_{a4}$) having one end connected to the ground. The inductor-capacitor is used to provide reactive current to guarantee ZVS of switches of secondary-side active auxiliary network 6. The inductors $L_{a3}$ and $L_{a4}$ are configured such that the output capacitors of the power semiconductors S1-S4 in active auxiliary network 6 are completely discharged prior to the rising edge of the gate pulses for the semiconductors. By doing this, ZVS is achieved for the power semiconductors S1-S4 at turn-on time.

Figure 5:
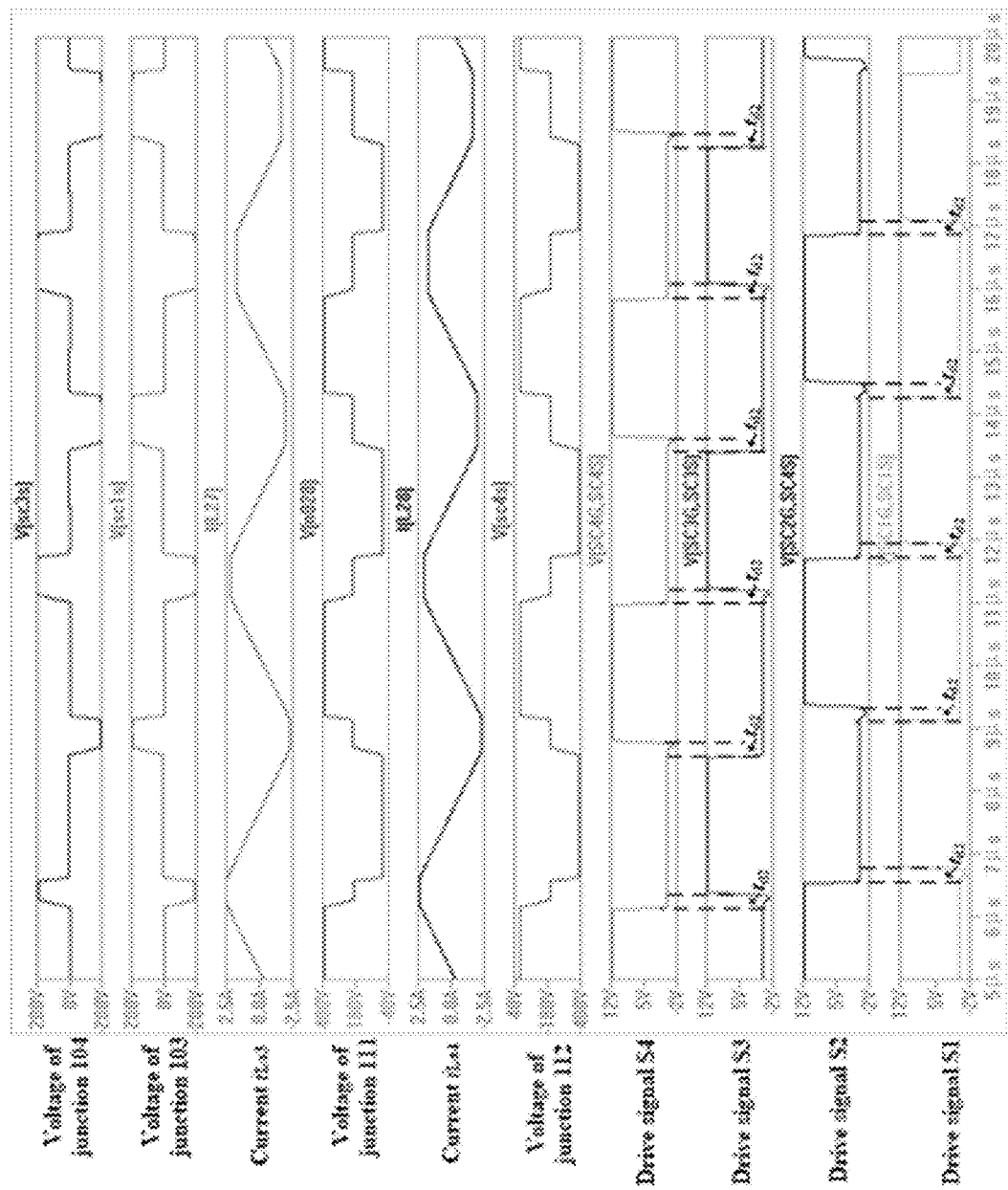
FIG. 5 illustrates exemplary waveforms of the secondary-side auxiliary inductor currents, driving signals of switches of secondary-side active auxiliary network and voltage of clamping capacitor, according to one or more embodiments of the present disclosure.

FIG. 5 shows the waveforms of driving signals S1, S2, S3 and S4, current $i_{La3}$ flowing through $L_{a3}$ and $C_{a3}$, current $i_{La4}$ flowing through $L_{a4}$ and $C_{a4}$, voltage of junction 111, and voltage of junction 112, in accordance with one or more embodiments of the present disclosure.

As illustrated, driving signals S1 (S3) and S2 (S4) are both 50% duty cycle square waves inverse with respect to each other. Since driving signals S1, S2, S3 and S4 drives MOSFETs S1, S2, S3 and S4 to generate the voltage waveform of junction 111 and 112. There is a brief dead time $t_{d2}$ between the driving signals S1 and S2. This ensures that the switches S1 and S2 are not simultaneously conductive, thereby preventing a short circuit across the clamping capacitor $C_f$. Similarly, there is brief dead time $t_{d2}$ between the driving signals S3 and S4 to ensure that the switches S3 and S4 are not simultaneously conductive. The reactive current $i_{La3}$ provides soft-switching for the power semiconductors, S1 and S3 while the reactive current $i_{La4}$ provides soft-switching for the power semiconductors, S2 and S4.

Figure 9D:
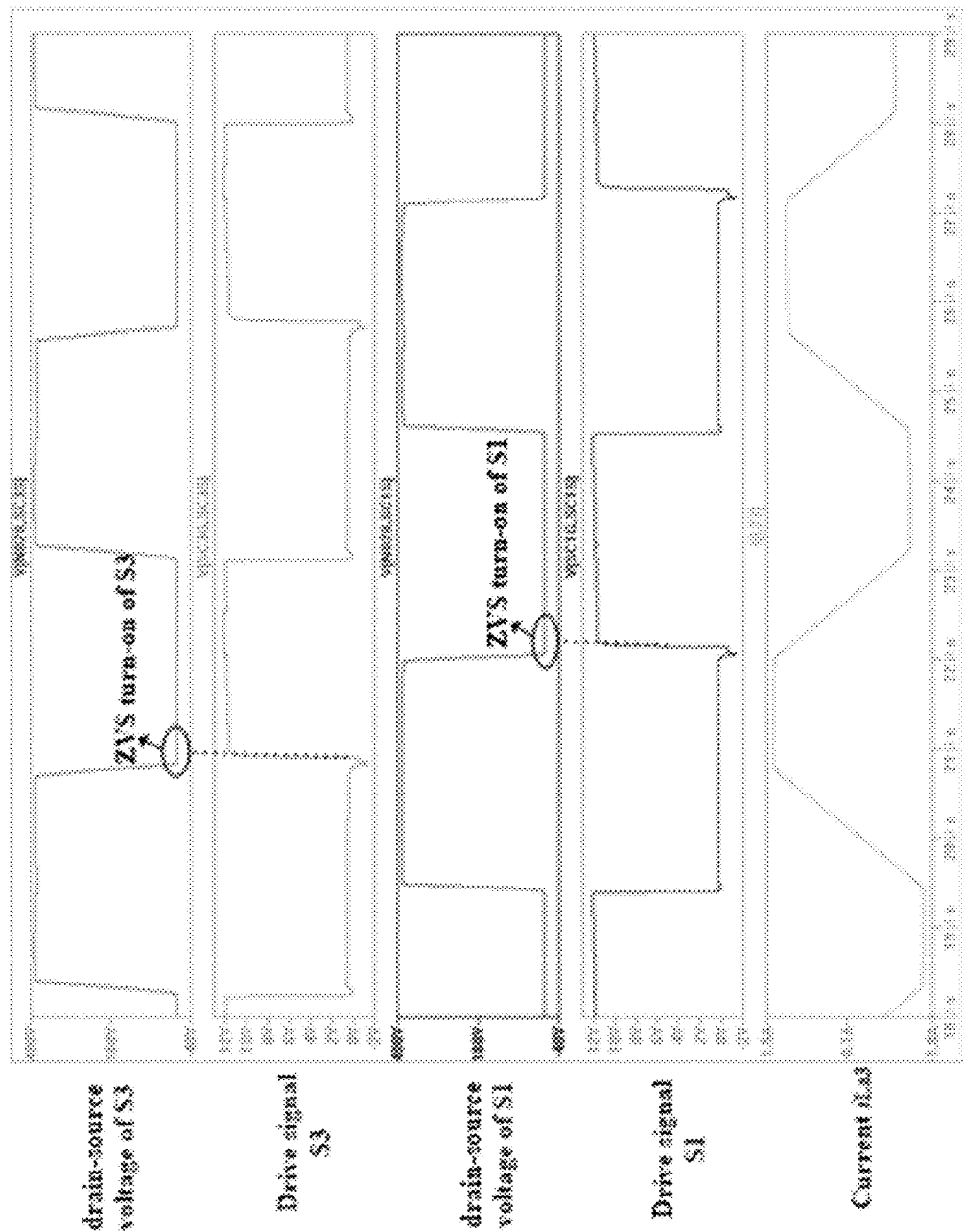
Figure 9E:
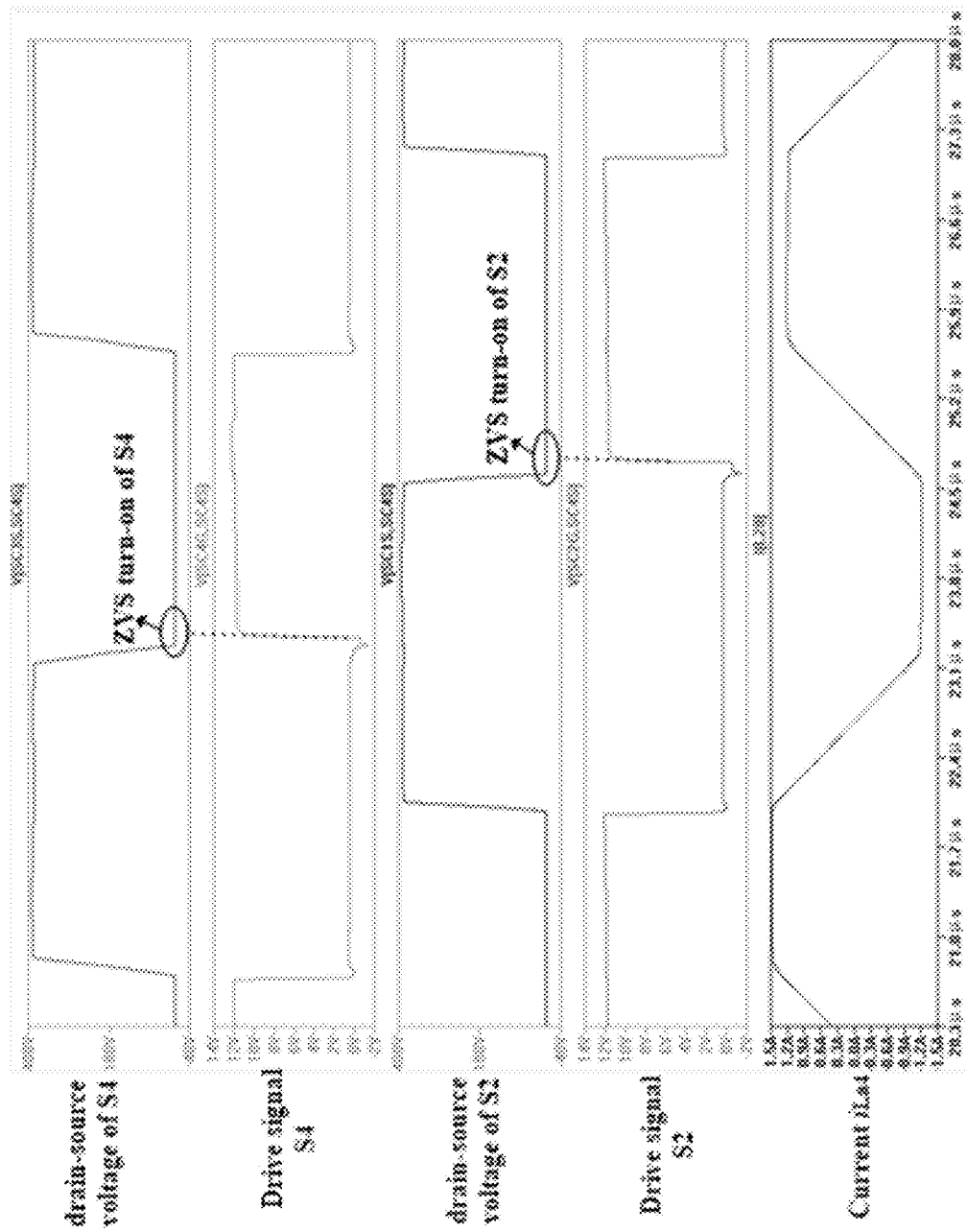

The switches S1~S4 have the same ZVS situation with M1~M4, respectively. As shown in FIG. 9D, the drain-to-source voltages of S1 and S3 have dropped to zero before switches S1 and S3 are turned on. M1 and M2 realize ZVS turn-on completely. Reactive current $I_{La2}$ is employed to extend the soft-switching range and guarantee ZVS of M1 and M2 under all operating conditions. Similar waveforms for the switches M2 and M4 can be observed in FIG. 9E, ZVS of switches M2 and M4 is obtained as well.

Figure 10:
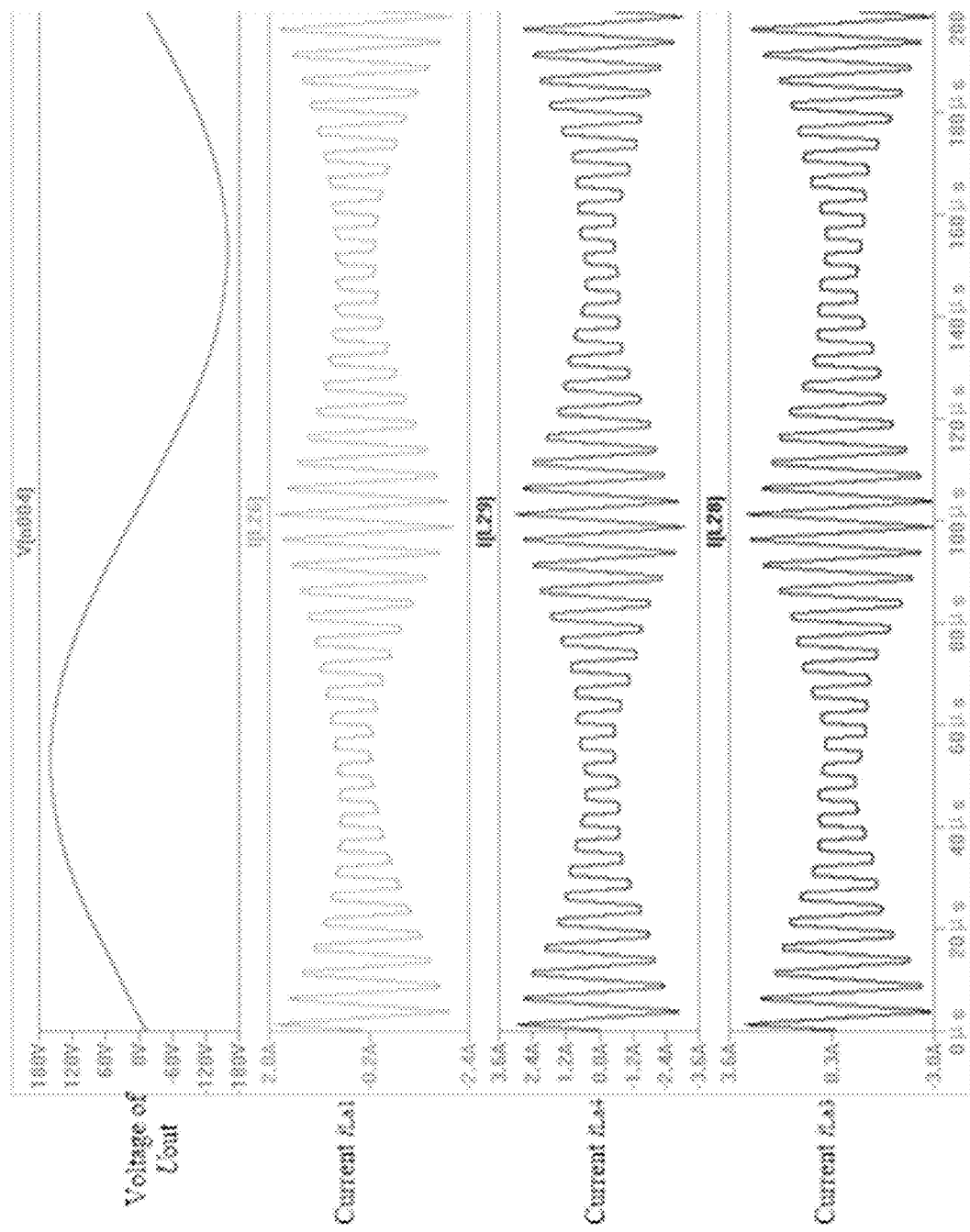
FIG. 10 illustrates exemplary waveforms of inductor currents $i_{LA1}$, $i_{La3}$ and $i_{La4}$ in relation to the output waveform, according to one or more embodiments of the present disclosure.

The configuration of auxiliary network 6 is different from that of the auxiliary network 2. This is partly due to that the snubber capacitor $C_f$ in auxiliary network 6 is used to recycle leakage inductor energy and suppress large voltage spikes. The auxiliary network 2 is used to guarantee the soft-switching for switches M1-M4. The two pairs of $L_{a3} \backslash C_{a3}$ and $C_{a4} \backslash L_{a4}$ are used to guarantee the soft-switching for switches S1-S4. However, the operating principles of primary-side auxiliary inductor $L_{a1}$ and secondary-side auxiliary inductors $L_{a3} \backslash L_{a4}$ are same where the auxiliary inductors ($L_{a1} \backslash L_a \backslash L_{a4}$) provides enough reactive current to extend the soft switching range for switches. FIG. 10 shows the waveforms of inductor current $i_{La1}$, $i_{La3}$ and $i_{La4}$. These inductor currents have same shape.

Output filter sub-circuit 7 is configured to receive the output PWM voltage signal 109 from bidirectional power switch sub-circuit 6 and generate output voltage signal 110 across equivalent load 8. In one implementation, output filter circuit 7 may be implementation using a conventional LC filter circuitry shown in FIG. 3B. Although equivalent load 8 is exemplified as a resistive load, equivalent load 8 can be an inductive load as well.

Figure 3C:
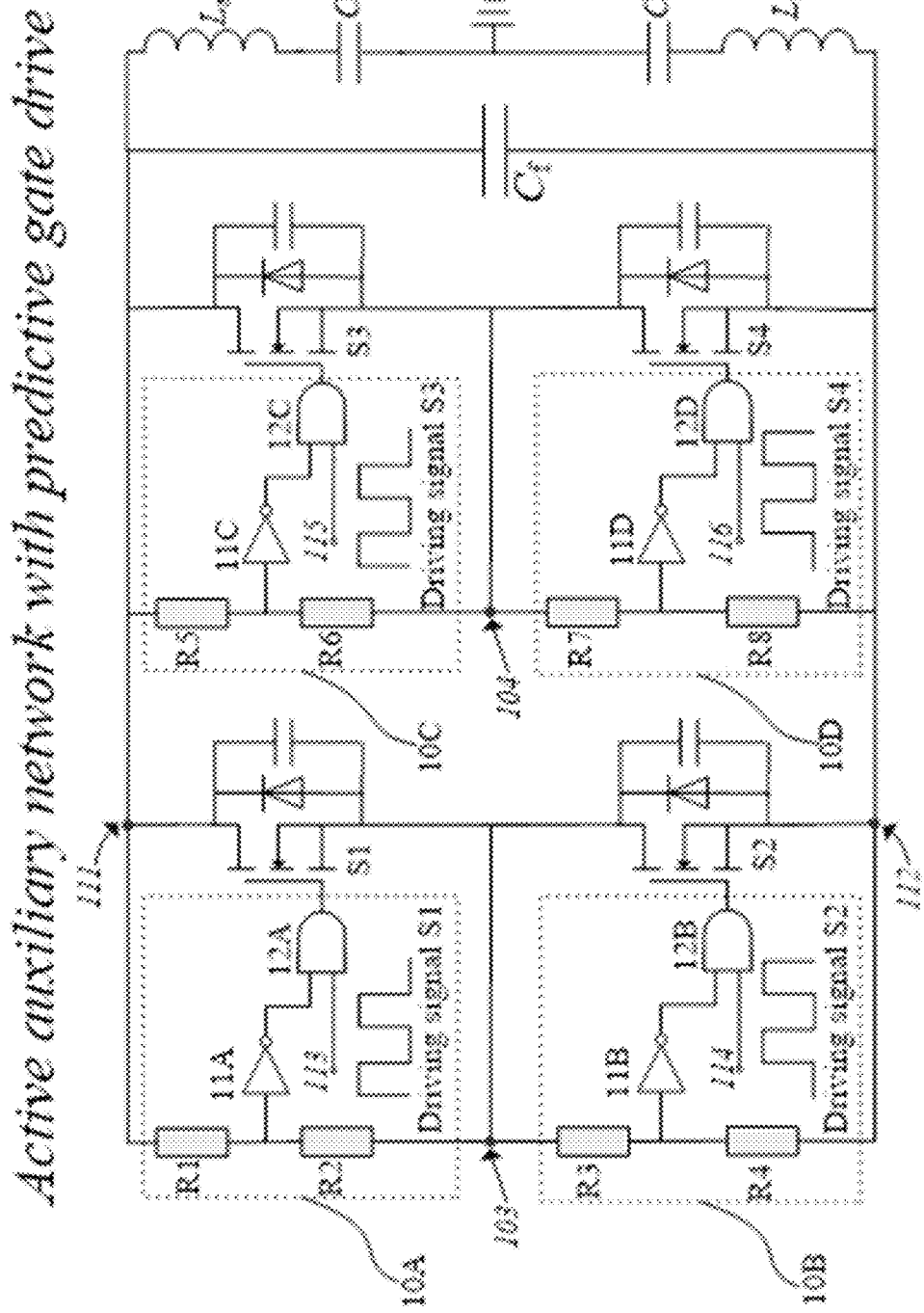
FIG. 3C illustrates a schematic of an examplary implementation of the secondary-side active auxiliary network with predictive gate drive, in accordance with one or more embodiments of the present disclosure.

The predictive gate drive sub-circuit 10 is configured to guarantee zero voltage switching for the power switching devices of active auxiliary network 6. In one implementation, FIG. 3C shows a detailed block diagram of the predictive gate drive technique according to one aspect of the present disclosure. As can be seen in the block diagram, there are four predictive gate drive sub-circuits 10A, 10B, 10C and 10D. Each sub-circuit such as 10A comprises one detection circuit and one logic circuit, where resistor R1 and R2 is used to detect the drain-to-source voltage of power switching device S1 and the logic circuit is comprised of one NOT gate 11A and one AND gate 12A.

The predictive gate drive sub-circuit 10A operates as follows:

The polarity of driving signal S1 is such that a high voltage signal causes the power switching devices S1 to be turned on, while a low voltage signal causes the power switching devices S1 to be turned off. When the drain-to-source voltage of switching device S1 is high, the NOT gate 11A output is low, therefore AND gate 12A output voltage is low and switch S1 can not been turned on. When the drain-to-source voltage of switching device S1 decreases to zero, the NOT gate 11A output is low and AND gate 12A output is high so as to allow the power switches to be turned on. Therefore, switch S1 can achieves zero voltage switching turn on completely.

One main advantage of the predictive gate drive technique is the dead-time adjustment for different switching devices and temperature to guarantee zero voltage switching for switches of secondary-side active auxiliary network. In one implementation, the predictive gate drive sub-circuit 10 is an "insurance policy" in achieving ZVS for S1-S4 in that the predictive gate drive sub-circuit 10 may be adopted in order to correctly generate the gate signals regardless of the normal or abnormal operating conditions.

Figure 11:
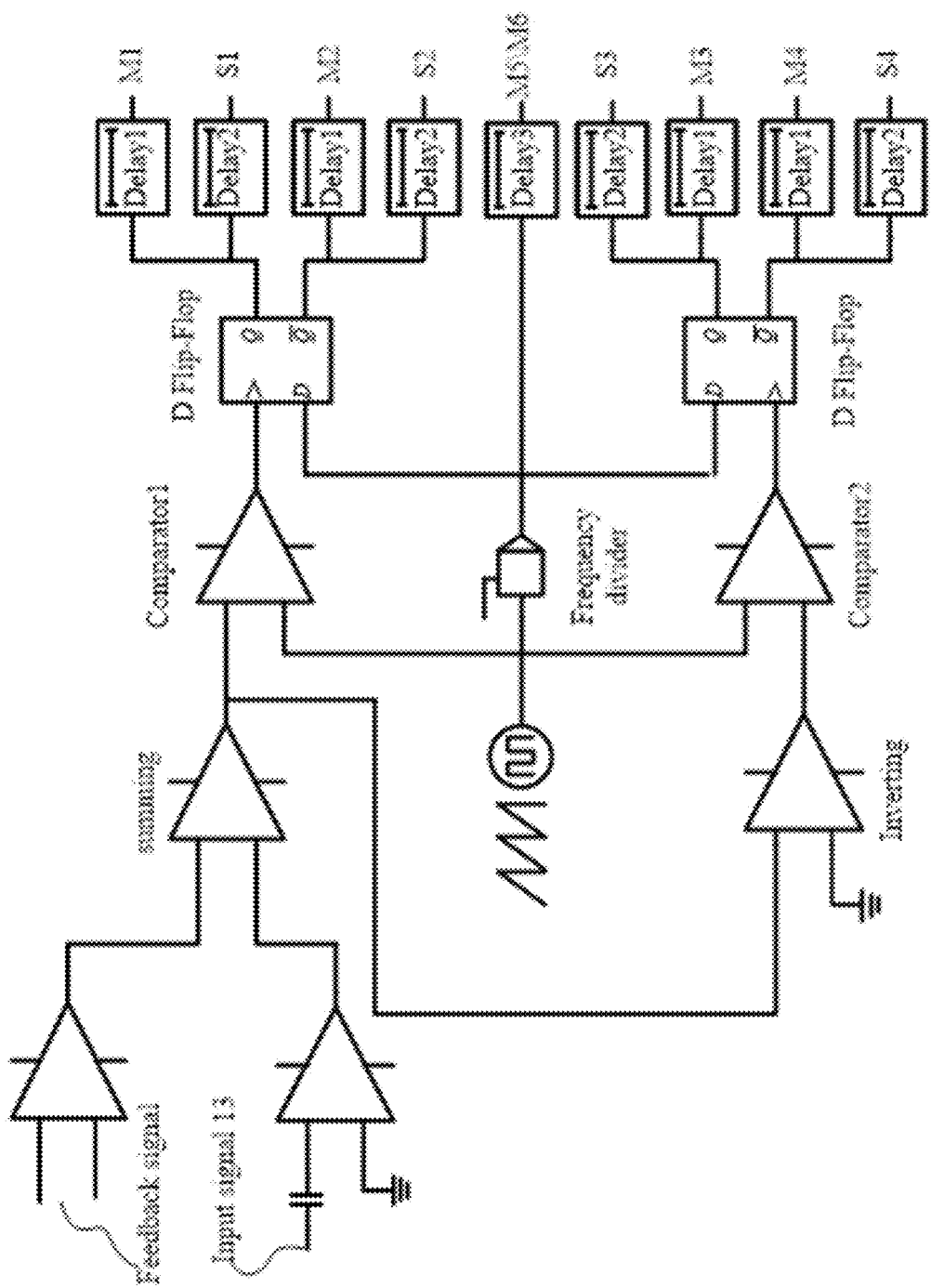
FIG. 11 illustrates an exemplary schematic of modulator circuit 12, according to one or more embodiments of the present disclosure.

FIG. 11 illustrates an exemplary schematic of modulator circuit 12, according to one or more embodiments of the present disclosure.

Modulator circuit 12 is configured to receive input signal 13, modulate input signal 13, generate control signal and supply the generated control signal to drive component modules including full-bridge sub-circuit 3, sub-circuit 5 and active auxiliary network 6 by power driving circuits 11.

As shown in FIG. 11, Modulator circuit 12 may supply control signals to full-bridge circuit 3 so as to drive full-bridge circuit 3 to generate high-frequency signals. Further, modulator circuit 12 may supply control signals to cycloconverter 5 so as to drive cycloconverter 5 to enable bidirectional power switch circuit 5A and 5B to produce output PWM voltage signal 109 shown in FIG. 3B. Modulator circuit 12 may supply driving signals to active auxiliary network 6 so as to driving active auxiliary network to absorb the leakage inductor energy and eliminate voltage spikes.

Modulator circuit 12 is the control module controlling both the primary side and the secondary side of isolation transformer sub-circuit 4 to achieve converting input signal 13 to output PWM voltage signal 109 shown in FIG. 3B and enable the switching power amplifier to achieve single stage power conversion from DC power supply to AC power.

Figure 6:
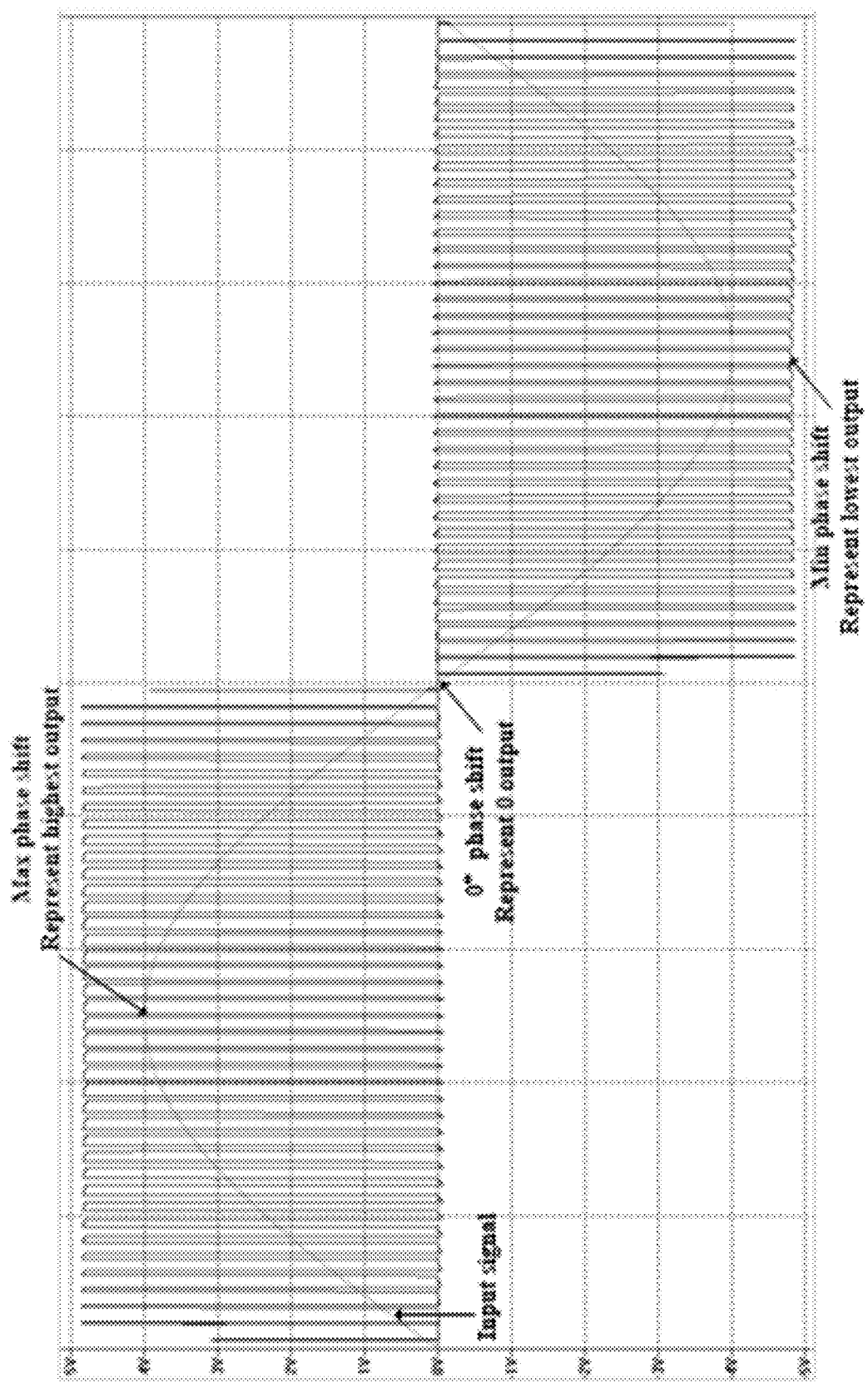
FIG. 6 illustrates exemplary waveforms of signals generated at different points of a amplification operation of the disclosed single stage switching power amplifier, according to one or more embodiments of the present disclosure.

FIG. 6 illustrates a waveform of PWM signal, with the waveform of input signal 13 being superimposed thereon.

As illustrated, for PWM signal level of input signal, each duty cycle corresponds to a sampled analog signal level of input signal. The narrowest pulse width (closest to 0% duty cycle) corresponds to zero analog signal level. The widest pulse width (closest to 100% duty cycle) corresponds to the highest or lowest signed signal level. Therefore, if audio input signal is a sine wave signal, as the signal level of input signal 13 keeps rising during a stretch, the corresponding series of successive pulse widths becomes wider and wider during the stretch. As the signal level of the input signal keeps falling during a stretch, the corresponding series of successive pulse widths becomes narrower and narrower during a stretch.

Figure 7:
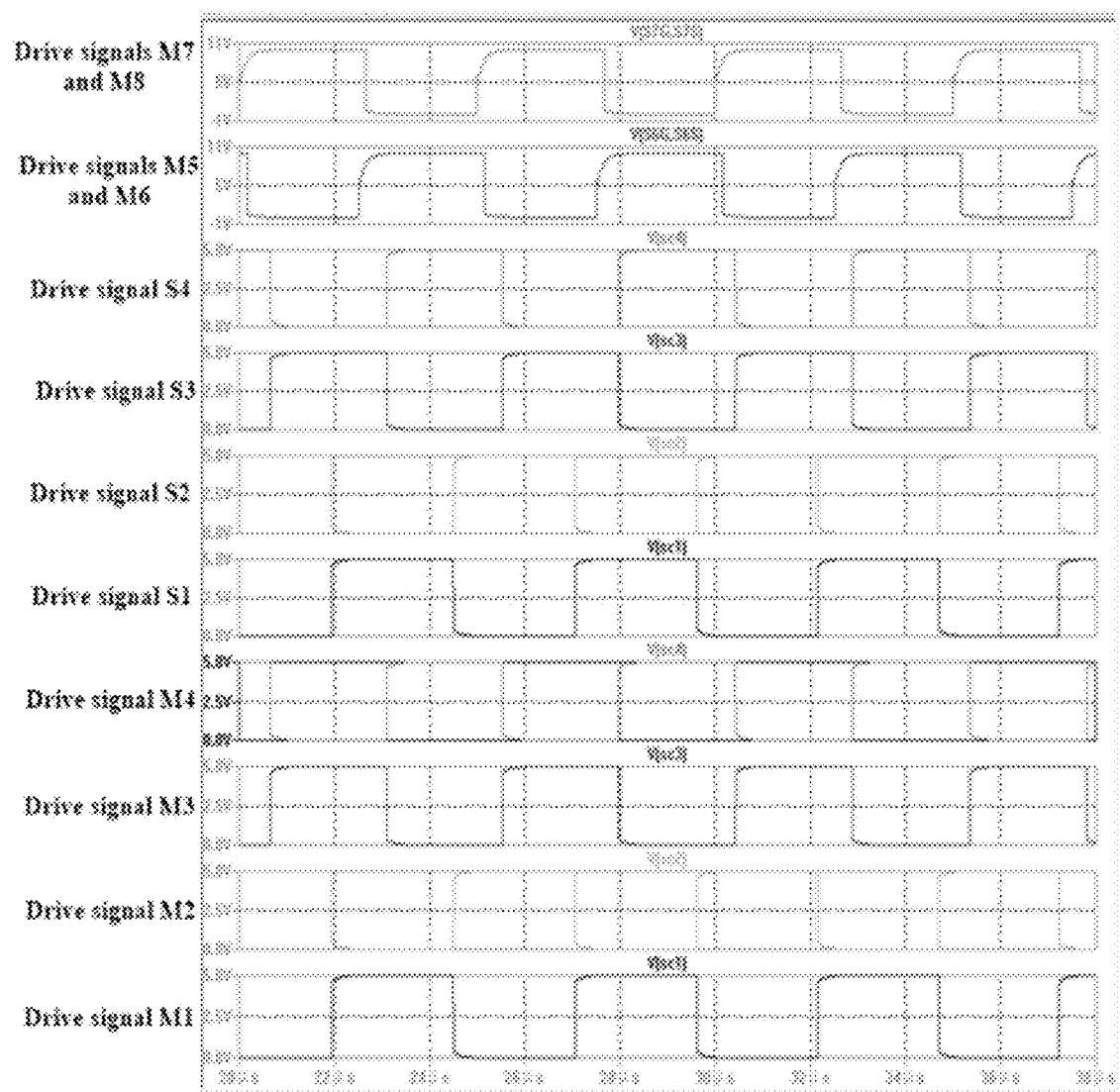
FIG. 7 illustrates exemplary waveforms of driving signals of all switches, according to one or more embodiments of the present disclosure.

FIG. 7 illustrates waveforms of all driving signals M1-M8 and S1-S4, according to one embodiment of the present disclosure. As shown, all driving signals M1-M8 and S1-S4 are all nearly equal 50% duty cycle square wave signals with the same frequency or fundamental frequency. For each signal pair of signal pairs (M1, M2), (M3, M4), (S1, S2), (S3, S4), (M5, M7), (M6, M8), the second signal is inverted from the first signal with respect to the common horizontal centerline of their respective waveforms. In particular, driving signals M1 and S1, M2 and S2, M3 and S3, M4 and S4, M5 and M6, M7 and M8 have the same waveforms, respectively. As well-known, the driving signal outputted by a driver transformer has the same waveform except that the amplitude of the former is stepped up (or stepped down) with respect to the amplitude of the latter. Thus, switches M5 and M6 are driven by a first set of same driving signals, while switches M7 and M8 are driven by a second set of same driving signals.

M1, M2, M3 and M4 are driving signals carrying information about audio input signal. More specifically, driving signals M1, M2, M3 and M4 are phase-shifted modulated with audio input signal with respect to reference signals M5, M6, M7 and M8. With respect to phase shifted modulation, in this embodiment, the range of phase shifts used for modulation is between −180° and 180°, with a 0° phase shift representing a zero analog signal level, with −180° and 180° phase shifts used to modulate the maximum absolute signal levels in positive and negative polarities, respectively. As a skilled artisan readily appreciates, the range of phase shifts used for modulation may also between, for example, −170° and 170°. Hence, the higher a signed signal level is, the closer to 180° the phase shift is. Similarly, the lower a signed signal level is, the closer to −180° the phase shift is.

Figure 8:
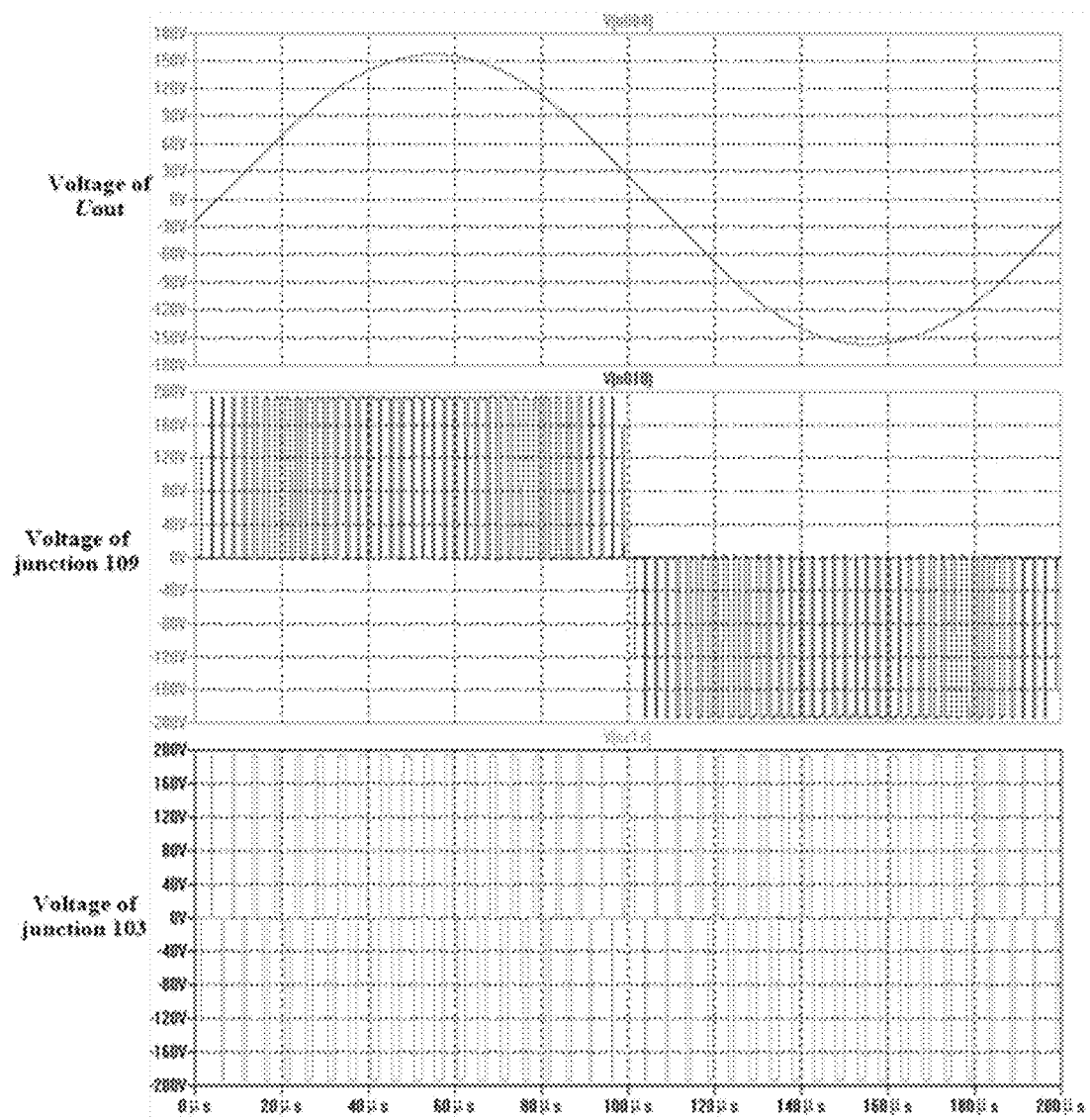
FIG. 8 illustrates exemplary waveforms of the output voltage, output PWM voltage and transformer secondary-side voltage, according to one or more embodiments of the present disclosure.

FIG. 8 illustrates waveforms of secondary-side voltage $U_{103}$ of high-frequency transformer, output load voltage $U_{out}$, output PWM voltage $U_{109}$, according to one embodiment of the present disclosure. The waveform of secondary-side voltage $U_{103}$ of high-frequency transformer is phase-shifted-modulated signals representing a signal level of audio input signal. The cycloconverter works as full-wave rectifier. Therefore the output PWM voltage comprises three so-called switching states, which are referred to below as 'positive state', 'zero state' and 'negative state'. The LC filter is configured to filter out the carrier frequency of amplifier output PWM voltage $U_{109}$, which is twice the frequency of secondary-side voltage $U_{103}$ of high-frequency transformer.

The present high-efficiency three-level (SS-3) power amplifier achieves fully zero voltage switching (ZVS) for all switches under different operating conditions from light load to rated load, which benefits with high efficiency and high switching frequency. All switches of the full soft-switching SS-3 power amplifier have in common the fact that high values of voltage and current never occur simultaneously during the turn-on commutations operation. The instantaneous value of the power loss as a product of voltage and current thus has only small values, so that the mean value of the switching power loss also remains small.

While the disclosure has been described with reference to one or more exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure.

A person understanding the present disclosure may now conceive of alternative structures and embodiments or variations of the above all of which are intended to fall within the scope of the present disclosure as defined in the claims that follow.

What is claimed is:

1. A circuit for use as a single-stage three-level power amplifier or a single-stage three-level inverter or DC/AC converter, the circuit having a first and a second terminals, the circuit comprising:
    a power supply sub-circuit coupled to and between the first and second terminals, the power supply configured to supply DC power;
    a high-frequency transformer having a primary winding center-tapped with a center-tap thereof, the primary winding having an upper terminal and a lower terminal, the transformer further having a secondary winding center-tapped with a center-tap thereof coupled to the ground, the secondary winding having an upper terminal and a lower terminal;
    a first full-bridge sub-circuit coupled to and between the first and second terminals and configured to receive DC power from the power supply sub-circuit, the first full-bridge sub-circuit having two switching legs both coupled to and between the first and second terminals, each said switching leg having two semiconductor switching devices coupled in series with each other via a respective junction point there-between, the two respective junction points of the two switching legs coupled to the respective upper and lower terminals of the primary winding, the first full-bridge sub-circuit configured to receive modulated switching driving signals modulated with an input signal and use received modulated switching driving signals to drive the semiconductor switching devices to generate, at the respective junction points of the two switching legs, high-frequency switching transformer-driving signals adapted to drive the primary winding through the upper and lower terminals of the primary winding to produce two amplified three-level modulated signals respectively at the upper and lower terminals of the secondary winding;
    a primary-side passive auxiliary network sub-circuit coupled to the first and second terminals and coupled to the center-tap of the primary winding, the primary-side passive auxiliary network sub-circuit comprising:
        a capacitive voltage divider sub-circuit coupled between the first and second terminals and having a first and a second capacitors coupled in series with each other via a voltage divider junction point; and
        an auxiliary inductor coupled between the voltage divider junction point and the center-tap of the primary winding; and
    wherein the primary-side passive auxiliary network sub-circuit is configured, through the capacitive voltage divider sub-circuit and the auxiliary inductor, to provide reactive current for the respective semiconductor switching devices of the switching legs so that the respective semiconductor switching devices of the switching legs achieve ZVS during respective switching operations.

2. A circuit as claimed in claim 1 wherein the modulated switching driving signals of the first full-bridge sub-circuit are phase-shift modulated with the input signal.

3. The circuit as claimed in claim 1, wherein at least one of the semiconductor switching devices of the first full-bridge sub-circuit comprises a MOSFET.

4. The circuit as claimed in claim 1, wherein the two respective modulated switching driving signals of each said switching leg of the first full-bridge sub-circuit are equal-frequency square waves inverse with respect to each other, and both have a duty-cycle equal to, or close to, 50%.

5. The circuit of claim 1, further comprising:
    a cycloconverter sub-circuit coupled to the upper and lower terminals of the secondary winding and configured to receive the two amplified three-level modulated signals respectively from the upper and lower terminals of the secondary winding, the cycloconverter sub-circuit configured to receive two switching reference signals used respectively as reference signals to the two amplified three-level modulated signals, the cycloconverter sub-circuit having two sets of bidirectional power switches driven respectively by the received two switching reference signals, the cycloconverter sub-circuit configured to generate and output an amplified three-level modulated output switching signal.

6. The circuit as claimed in claim 5, further comprising:
    an output filter sub-circuit having a series inductor and a shunt capacitor, the output filter sub-circuit configured to receive the amplified three-level modulated output switching signal and generate an output result signal over a load.

7. The circuit of claim 1, further comprising:
    a secondary-side active auxiliary network sub-circuit having a second full-bridge sub-circuit and coupled to the upper and lower terminals of the secondary winding, the secondary-side active auxiliary network configured to absorb energy of a leakage inductor of the transformer so as to remove otherwise resulting voltage spikes and ringing at the upper and lower terminals of the secondary winding, the second full-bridge sub-circuit configured to achieve ZVS with respect to semiconductor switching devices forming the second full-bridge sub-circuit.

8. The circuit of claim 7, wherein the secondary-side active auxiliary network sub-circuit comprises:
    the second full-bridge sub-circuit having two switching legs, each said switching leg coupled to and between an upper common node and a lower common node and having two semiconductor switching devices coupled in series with each other via a respective junction point there-between, the two respective junction points of the two switching legs respectively coupled to the upper and lower terminals of the secondary winding;
    a clamping capacitor coupled to and between the upper and lower common nodes and coupled to the second full-bridge sub-circuit via the upper and lower common nodes, the clamping capacitor configured to absorb said energy of the leakage inductor of the transformer and remove said otherwise resulting voltage spikes and ringing at the upper and lower terminals of the secondary winding through said coupling to the second full-bridge sub-circuit;

an inductor-capacitor pairs sub-circuit coupled to and between the upper and lower common nodes and coupled to the second full-bridge sub-circuit via the upper and lower common nodes, the inductor-capacitor pairs sub-circuit having an upper inductor-capacitor pair and a lower inductor-capacitor pair coupled in series with each other via a junction point coupled to the ground, each said inductor-capacitor pair having a respective inductor and a respective capacitor coupled in series with each other, one end of the respective inductor of the upper inductor-capacitor pair and one end of the respective inductor of the lower inductor-capacitor pair respectively coupled to the upper and lower common nodes; and wherein the second full-bridge sub-circuit is configured to receive respective switching driving signals to drive the respective semiconductor switching devices of its two switching legs, each of the received respective switching driving signals derived from one of the modulated switching driving signals of the first full-bridge sub-circuit with respect to timings of signal switching so that respective timings of switching operations of the respective semiconductor switching devices of its two switching legs are derived from the respective timings of switching operations of the semiconductor switching devices of the first full-bridge sub-circuit; and wherein the upper and lower inductor-capacitor pairs are configured to provide reactive current for the semiconductor switching devices of the second full-bridge sub-circuit so that the semiconductor switching devices of the second full-bridge sub-circuit, with their respective timings of switching operations derived from respective timings of switching operations of the semiconductor switching devices of the first full-bridge sub-circuit, achieve ZVS during respective switching operations.

9. The circuit as claimed in claim 8, wherein the inductors of the inductor-capacitor pairs sub-circuit of the active secondary-side auxiliary network have same inductance.

* * * * *